United States Patent
Sano et al.

(10) Patent No.: US 7,579,093 B2
(45) Date of Patent: Aug. 25, 2009

(54) ORGANIC ELECTROLUMINESCENT DEVICE

(75) Inventors: Satoshi Sano, Kanagawa (JP); Tatsuya Igarashi, Kanagawa (JP); Toshihiro Ise, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 635 days.

(21) Appl. No.: 11/227,162

(22) Filed: Sep. 16, 2005

(65) Prior Publication Data

US 2006/0060842 A1    Mar. 23, 2006

(30) Foreign Application Priority Data

Sep. 17, 2004    (JP)    ............ P.2004-271064

(51) Int. Cl.
*H01L 51/54*    (2006.01)
*C09K 11/06*    (2006.01)

(52) U.S. Cl. ............ 428/690; 428/917; 313/504; 257/E51.044; 546/4

(58) Field of Classification Search ............ None
See application file for complete search history.

(56) References Cited

U.S. PATENT DOCUMENTS

| | | | |
|---|---|---|---|
| 6,303,238 B1 | 10/2001 | Thompson et al. | |
| 6,653,564 B2 | 11/2003 | Scheidle | |
| 7,442,797 B2 * | 10/2008 | Itoh et al. | 546/6 |
| 2005/0227112 A1 * | 10/2005 | Ise et al. | 428/690 |
| 2005/0260444 A1 * | 11/2005 | Forrest et al. | 428/690 |
| 2005/0260446 A1 * | 11/2005 | Mackenzie et al. | 428/690 |
| 2006/0134461 A1 * | 6/2006 | Huo et al. | 428/690 |
| 2006/0172146 A1 * | 8/2006 | Igarashi et al. | 428/690 |

FOREIGN PATENT DOCUMENTS

| | | |
|---|---|---|
| JP | 2002-363552 A | 12/2002 |
| WO | WO 2004/039781 A1 | 5/2004 |
| WO | WO 2004/039914 A1 | 5/2004 |

OTHER PUBLICATIONS

Wei Lu et al., "Light-Emitting Tridentate Cyclometalated Platinum(II) Complexes Containing σ-Alkynyl Auxiliaries: Tuning of Photo- and Electrophosphorescence"(2004) J. AM. Chem. Soc., vol. 126, pp. 4958-4971.

Qinde Liu et al., "New red-orange phosphorescent/electroluminescent cycloplatinated complexes of 2,6-bis(2'-indolyl)pyridine†" (2002) J. Chem. Soc., pp. 3234-3240.

\* cited by examiner

*Primary Examiner*—Marie R. Yamnitzky
(74) *Attorney, Agent, or Firm*—Sughrue Mion, PLLC

(57) ABSTRACT

An organic electroluminescent device having a pair of electrodes, at least one organic layer between the pair of electrodes, the one organic layer including a light-emitting layer, wherein the one organic layer contains a compound represented by formula (I):

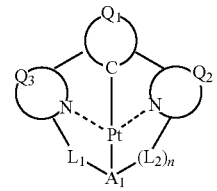

wherein $Q_1$ represents an atomic group necessary for forming an unsaturated ring together with the carbon atom, $Q_2$ and $Q_3$ each independently represents an atomic group necessary for forming an unsaturated ring together with the nitrogen atom, the atomic group of each of $Q_1$, $Q_2$ and $Q_3$ may have a hydrogen atom or a substituent, $L_1$ and $L_2$ each independently represents a linking group which may have a substituent, n represents 0 or 1, and $A_1$ represents a structure containing an atom bonded to the platinum atom.

13 Claims, No Drawings

ORGANIC ELECTROLUMINESCENT DEVICE

FIELD OF THE INVENTION

The present invention relates to organic platinum complexes and a device, particularly an organic electroluminescent device (EL device), containing the organic platinum complex.

BACKGROUND OF THE INVENTION

In recent development of an organic EL device, various studies are being made to enhance the external quantum efficiency. Particularly, a device containing a phosphorescent material using a heavy metal such as iridium and platinum can achieve high efficiency and is attracting attention. As for the development of a light-emitting material using platinum, a tridentate ligand coupled with three aryl groups has been reported (see, WO 04/039781, WO 04/039914, JP-A-2002-363552, *Journal of the American Chemical Society*, Vol. 126, pp. 4958-4971 (2004) and *Journal of the Chemical Society, Dalton Transactions*, pp. 3234-3240 (2002)). Such a platinum complex is characterized in that the light emission wavelength can be shortened as compared with tetradentate platinum complexes such as octaethylporphyrin platinum complex (see, U.S. Pat. No. 6,303,238(B1) and U.S. Pat. No. 6,653,564(B1)). However, when a unidentate ligand remains and particularly, a halogen atom such as chlorine is used, the device using the light-emitting material containing such a ligand is in need of improvement of durability.

SUMMARY OF THE INVENTION

An object of an illustrative, non-limiting embodiment of the invention is to provide an organic platinum complex excellent in the light-emitting property (quantum yield, driving voltage), durability and vapor deposition property, and a light-emitting device containing the same.

The above-described object can be attained by the following means.

(1) An organic electroluminescent device including: a pair of electrodes; and at least one organic layer between the pair of electrodes, the at least one organic layer including a light-emitting layer, wherein the at least one organic layer contains a compound represented by formula (I):

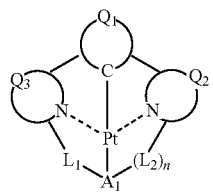

wherein $Q_1$ represents an atomic group necessary for forming an unsaturated ring together with the carbon atom; $Q_2$ and $Q_3$ each independently represents an atomic group necessary for forming an unsaturated ring together with the nitrogen atom; when each atomic group constituting $Q_1$, $Q_2$ and $Q_3$ can be further substituted, the atomic group may have a hydrogen atom or a substituent; $L_1$ and $L_2$ each independently represents a linking group which may have a substituent; n represents 0 or 1; and $A_1$ represents a structure containing an atom bonded to the platinum atom.

(2) An organic electroluminescent device including a pair of electrodes; and at least one organic layer between the pair of electrodes, the at least one organic layer including a light-emitting layer, wherein the at least one organic layer contains a compound represented by formula (II):

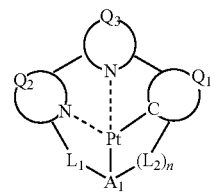

wherein $Q_1$, $Q_2$, $Q_3$, $L_1$, $L_2$, n and $A_1$ have the same meanings as $Q_1$, $Q_2$, $Q_3$, $L_1$, $L_2$, n and $A_1$ in formula (I).

(3) An organic electroluminescent device including: a pair of electrodes; and at least one organic layer between the pair of electrodes, the at least one organic layer including a light-emitting layer, wherein the at least one organic layer contains a compound represented by formula (III):

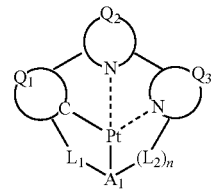

wherein $Q_1$, $Q_2$, $Q_3$, $L_1$, $L_2$, n and $A_1$ have the same meanings as $Q_1$, $Q_2$, $Q_3$ $L_1$, $L_2$, n and $A_1$ in formula (I).

(4) An organic electroluminescent device including: a pair of electrodes; and at least one organic layer between the pair of electrodes, the at least one organic layer including a light-emitting layer, wherein the at least one organic layer contains a compound represented by formula (IV):

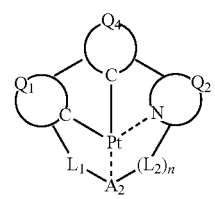

wherein $Q_1$, $Q_2$, $L_1$, $L_2$ and n have the same meanings as $Q_1$, $Q_2$, $L_1$, $L_2$ and n in formula (I), and $Q_4$ has the same meaning as $Q_1$ in formula (I), (5) An organic electroluminescent device including: a pair of electrodes, and at least one organic layer between the pair of electrodes, the at least one organic layer including a light-emitting layer, wherein the at least one organic layer contains a compound represented by formula (V):

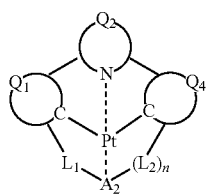

wherein $Q_1$, $Q_2$, $Q_4$, $L_1$, $L_2$, $A_2$ and n have the same meanings as $Q_1$, $Q_2$, $Q_4$, $L_1$, $L_2$ and n in formula (IV).

(6) An organic electroluminescent device including: a pair of electrodes; and at least one organic layer between the pair of electrodes, the at least one organic layer including a light-emitting layer, wherein the at least one organic layer contains a compound represented by formula (VI):

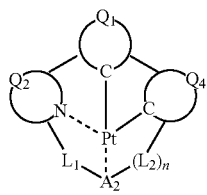

wherein $Q_1$, $Q_2$, $Q_4$, $L_1$, $L_2$, $A_2$ and n have the same meanings as $Q_1$, $Q_2$, $Q_4$, $L_1$, $L_2$ and n in formula (IV).

(7) The organic electroluminescent device as described in (1), wherein the compound represented by formula (I) is a compound represented by formula (VII):

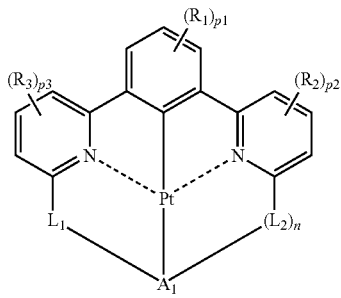

wherein $R_1$, $R_2$ and $R_3$ each independently represents a substituent, which can be further substituted; p1, p2 and p3 each independently represents an integer of 0 to 3; when p1 to p3 each is 2 or more, multiple $R_1$s, $R_2$s or $R_3$s may be the same or different and each pair of $R_1$ and $R_1$, $R_2$ and $R_2$, $R_3$ and $R_3$, $R_1$ and $R_2$, $R_2$ and $R_3$, and $R_1$ and $R_3$ may combine with each other to form a ring; when p1 is 0, the benzene ring has no $R_1$, and when p2 and p3 each is 0, the pyridine rings have no $R_2$ and $R_3$; and $L_1$, $L_2$, n and $A_1$ have the same meanings as $L_1$, $L_2$, n and $A_1$ in formula (I).

(8) The organic electroluminescent device as described in (2), wherein the compound represented by formula (II) is a compound represented by formula (VIII):

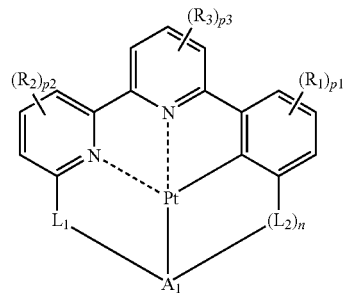

wherein $R_1$, $R_2$, $R_3$, p1, p2 and p3 have the same meanings as $R_1$, $R_2$, $R_3$, p1, p2 and p3 in formula (VII), and $L_1$, $L_2$, n and $A_1$ have the same meanings as $L_1$, $L_2$, n and $A_1$ in formula (I).

(9) The organic electroluminescent device as described in (3), wherein the compound represented by formula (III) is a compound represented by formula (IX):

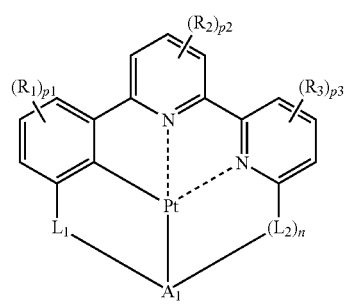

wherein $R_1$, $R_2$, $R_3$, p1, p2 and p3 have the same meanings as $R_1$, $R_2$, p1, p2 and p3 in formula (VII), and $L_1$, $L_2$, n and $A_1$ have the same meanings as $L_1$, $L_2$, n and $A_1$ in formula (I).

(10) The organic electroluminescent device as described in (4), wherein the compound represented by formula (IV) is a compound represented by formula (X):

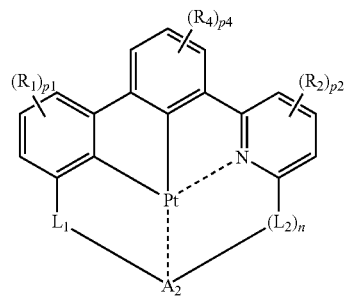

wherein $R_1$, $R_2$ and $R_4$ each independently represents a substituent, which can be further substituted, the substituent may have a substituent; p1, p2 and p4 each independently represents an integer of 0 to 3; when p1, p2 and p4 each is 2 or more, multiple $R_1$s, $R_2$s or $R_4$s may be the same or different and each pair of $R_1$ and $R_1$, $R_2$ and $R_2$, $R_4$ and $R_4$, $R_1$ and $R_2$, $R_2$ and $R_4$, and $R_1$ and $R_4$ may combine with each other to form a ring; when p1 and p4 each is 0, the benzene rings have no $R_1$ and $R_4$, and when p2 is 0, the pyridine ring has no $R_2$, and $L_1$, $L_2$ and n have the same meanings as $L_1$, $L_2$ and n in formula (I).

(11) The organic electroluminescent device as described in (5), wherein the compound represented by formula (V) is a compound represented by formula (XI):

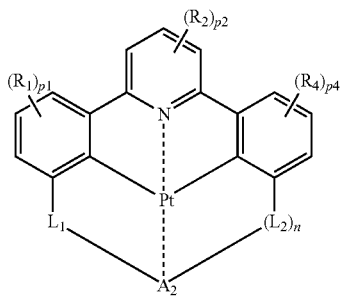

wherein $R_1$, $R_2$, $R_4$, p1, p2 and p4 have the same meanings as $R_1$, $R_2$, $R_4$, p1, p2 and p4 in formula (X), $L_1$, L and n have the same meanings as $L_1$, $L_2$ and n in formula (I), and $A_2$ has the same meaning as $A_2$ in formula (XII).

(12) The organic electroluminescent device as described in (6), wherein the compound represented by formula (VI) is a compound represented by formula (XII):

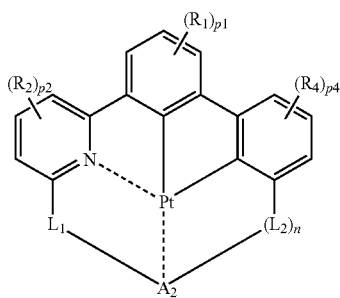

wherein $R_1$, $R_2$, $R_4$, p1, p2 and p4 have the same meanings as $R_1$, $R_2$, $R_4$, p1, p2 and p4 in formula (XIII), $L_1$, $L_2$ and n have the same meanings as $L_1$, $L_2$ and n in formula (I), and has the same meaning as $A_2$ in formula (X).

Platinum complexes of the present invention and a light-emitting device containing the same have good durability. The light emitting device of the present invention can be suitably used in the fields of display device, display, backlight, electrophotography, illumination light source, recording light source, exposure light source, reading light source, marking, signboard, interior, optical communication and the like. Furthermore, the compounds of the present invention are applicable also to medical usage, fluorescent brightening agent, photographic material, UV absorbing material, laser dye, recording medium material, pigment for inkjet recording, color filter dye, color conversion filter, analysis usage and the like.

DETAILED DESCRIPTION OF THE INVENTION

Formulae (I) to (XII) are described.

$Q_1$ and $Q_4$ each independently represents an atomic group necessary for forming an unsaturated ring together with the carbon atom, and $Q_2$ and $Q_3$ each independently represents an atomic group necessary for forming an unsaturated ring together with the nitrogen atom. The atomic group comprises an atom selected from carbon, nitrogen, silicon, sulfur, oxygen, germanium and phosphorus. The bond between atoms constituting the unsaturated ring may be any combination of a single bond, a double bond and a triple bond. $Q_1$, $Q_2$, A, and $Q_4$ each is preferably formed from a carbon, nitrogen, silicon, sulfur or oxygen atom, more preferably from a carbon, nitrogen or silicon atom, still more preferably from a carbon or nitrogen atom. In particular, preferred is the case where $Q_1$, $Q_2$, $Q_3$ and $Q_4$ all are an atomic group comprising a carbon atom, $Q_1$ and $Q_4$ each forms a substituted benzene ring and $Q_2$ and $Q_3$ each forms a substituted pyridine ring. When the atomic group constituting $Q_1$, $Q_2$, $Q_3$ or $Q_4$ can be further substituted, the atomic group may have a substituent.

Examples of the substituent include an alkyl group (preferably having from 1 to 30 carbon atoms, more preferably from 1 to 20 carbon atoms, still more preferably from 1 to 10 carbon atoms, e.g., methyl, ethyl, iso-propyl tert-butyl, n-octyl, n-decyl, n-hexadecyl), a cycloalkyl group (preferably having from 3 to 30 carbon atoms, more preferably from 3 to 20 carbon atoms, still more preferably from 3 to 10 carbon atoms, e.g., cyclopropyl, cyclopentyl, cyclohexyl), an alkenyl group preferably having from 2 to 30 carbon atoms, more preferably from 2 to 20 carbon atoms, still more preferably from 2 to 10 carbon atoms, e.g., vinyl, allyl, 2-butenyl, 3-pentenyl), an alkynyl group preferably having from 2 to 30 carbon atoms, more preferably from 2 to 20 carbon atoms, still more preferably from 2 to 10 carbon atoms, e.g., propargyl, 3-pentynyl), an aryl group (preferably having from 6 to 30 carbon atoms, more preferably from 6 to 20 carbon atoms, still more preferably from 6 to 12 carbon atoms, e.g., phenyl, p-methylphenyl, naphthyl, anthranyl), an amino group (preferably having from 0 to 30 carbon atoms, more preferably from 0 to 20 carbon atoms, still more preferably from 0 to 10 carbon atoms; the amino group includes an alkylamino group, an arylamino group and a heterocyclic amino group, e.g., amino, methylamino, dimethylamino, diethylamino, dibenzylamino, diphenylamino, ditolylamino), an alkoxy group preferably having from 1 to 30 carbon atoms, more preferably from 1 to 20 carbon atoms, still more preferably from 1 to 10 carbon atoms, e.g., methoxy, ethoxy, butoxy, 2-ethylhexyloxy), an aryloxy group preferably having from 6 to 30 carbon atoms, more preferably from 6 to 20 carbon atoms, still more preferably from 6 to 12 carbon atoms, e.g., phenyloxy, 1-naphthyloxy, 2-naphthyloxy), a heterocyclic oxy group (preferably having from 1 to 30 carbon atoms, more preferably from 1 to 20 carbon atoms, still more preferably from 1 to 12 carbon atoms, e.g., pyridyloxy, pyrazyloxy, pyrimidyloxy, quinolyloxy), an acyl group (preferably having from 1 to 30 carbon atoms, more preferably from 1 to 20 carbon atoms, still more preferably from 1 to 12 carbon atoms, e.g., acetyl, benzoyl, formyl, pivaloyl), an alkoxycarbonyl group (preferably having from 2 to 30 carbon atoms, more preferably from 2 to 20 carbon atoms, still more preferably from 2 to 12 carbon atoms, e.g., methoxycarbonyl, ethoxycarbonyl), an aryloxycarbonyl group (preferably having from 7 to 30 carbon atoms, more preferably born 7 to 20 carbon atoms, still more preferably from 7 to 12 carbon atoms, e.g., phenyloxycarbonyl), an acyloxy group (preferably having from 2 to 30 carbon atoms, more preferably from 2 to 20 carbon atoms, still more preferably from 2 to 10 carbon atoms, e.g., acetoxy, benzoyloxy), an acylamino group (preferably having from 2 to 30 carbon atoms, more preferably from 2 to 20 carbon atoms, still more preferably from 2 to 10 carbon atoms, e.g., acetylamino, benzoylamino), an alkoxycarbonylamino group (preferably having from 2 to 30 carbon atoms, more preferably from 2 to 20 carbon atoms, still more preferably from 2 to 12 carbon atoms, e.g., methoxycarbonylamino), an aryloxycarbonylamino group (preferably having from 7 to 30 carbon atoms, more preferably from 7 to 20 carbon atoms, still more preferably from 7 to 12 carbon atoms, e.g., phenyloxycarbonylamino), a sulfonylamino group (preferably having from 1 to 30 carbon atoms, more preferably from 1 to 20 carbon atoms, still more preferably from 1 to 12 carbon atoms, e.g., methanesulfonylamino, benzenesulfonylamino), a sulfamoyl group (preferably having from 0 to 30 carbon atoms, more preferably from 0 to 20 carbon atoms, still more preferably from 0 to 12 carbon atoms, e.g., sulfamoyl, methylsulfamoyl, dimethylsulfamoyl, phenylsulfamoyl), a carbamoyl group (preferably having from 1 to 30 carbon atoms, more preferably from 1 to 20 carbon atoms, still more preferably from 1 to 12 carbon atoms, e.g., carbamoyl, methylcarbamoyl, diethylcarbamoyl, phenylcarbamoyl), an alkylthio group (preferably having from 1 to 30 carbon atoms, more preferably from 1 to 20 carbon atoms, still more preferably from 1 to 12 carbon atoms, e.g., methylthio, ethylthio), an arylthio group (preferably having from 6 to 30 carbon atoms, more preferably from 6 to 20 carbon atoms, still more preferably from 6 to 12 carbon atoms, e.g., phenylthio), a heterocyclic thio group preferably having from 1 to 30 carbon atoms, more preferably from 1 to 20 carbon atoms, still more preferably from 1 to 12 carbon atoms, e.g., pyridylthio, 2-benzimidazolylthio, 2-benzoxazolylthio, 2-benzothiazolylthio), a sulfonyl group (preferably having from 1 to 30 carbon atoms, more preferably from 1 to 20 carbon atoms, still more preferably from 1 to 12 carbon atoms, e.g., mesyl, tosyl), a sulfinyl group (preferably having from 1 to 30 carbon atoms, more preferably from 1 to 20 carbon atoms, still more preferably from 1 to 12 carbon atoms, e.g., methanesulfinyl, benzenesulfinyl), a ureido group (preferably having from 1 to 30 carbon atoms, more preferably from 1 to 20 carbon atoms, still more preferably from 1 to 12 carbon atoms, e.g., ureido, methylureido, phenylureido), a phosphoric acid amide group (preferably having from 1 to 30 carbon atoms, more preferably from 1 to 20 carbon atoms, still more preferably from 1 to 12 carbon atoms, e.g., diethylphosphoric acid amide, phenylphosphoric acid amide), a hydroxy group, a mercapto group, a halogen atom (e.g., fluorine, chlorine, bromine, iodine), a cyano group, a sulfo group, a carboxyl group, a nitro group, a hydroxamic acid group, a sulfino group, a hydrazino group, an imino group, a heterocyclic group (preferably having from 1 to 30 carbon atoms, more preferably from 1 to 12 carbon atoms; examples of the heteroatom include a nitrogen atom, an oxygen atom and a sulfur atom; specific examples of the heterocyclic group include imidazolyl, pyridyl, quinolyl, furyl, thienyl, piperidyl, morpholino, benzoxazolyl, benzimidazolyl, benzothiazolyl, carbazolyl and azepinyl), a silyl group (preferably having from 3 to 40 carbon atoms, more preferably from 3 to 30 carbon atoms, still more preferably from 3 to 24 carbon atoms, e.g., trimethylsilyl, triphenylsilyl), and a silyloxy group (preferably having from 3 to 40 carbon atoms, more preferably from 3 to 30 carbon atoms, still more preferably from 3 to 24 carbon atoms, e.g., trimethylsilyloxy, triphenylsilyloxy). These substituents each may further be substituted and, for example, the alkyl group above includes a substituted alkyl group, $A_1$ represents a structure containing an atom bonded to the platinum atom. The structure of $A_1$ is preferably a group bonded through a carbon atom, a group bonded through a nitrogen atom, a group bonded through a silicon atom, a group bonded through a phosphorus atom, a group bonded through an oxygen atom or a group bonded through a sulfur atom, more preferably a group bonded through a carbon atom, a nitrogen atom, an oxygen atom or a sulfur atom, still more preferably a group bonded through a carbon atom, nitrogen atom or an oxygen atom, yet still more preferably a group bonded through a carbon atom or an oxygen atom.

The group bonded through a carbon atom is preferably a substituted or unsubstituted aryl group bonded through a carbon atom, a substituted or unsubstituted 5-membered aromatic heterocyclic group bonded through a carbon atom, or a substituted or unsubstituted 6-membered aromatic heterocyclic group bonded through a carbon atom, more preferably a substituted or unsubstituted aryl group bonded through a carbon atom, a substituted or unsubstituted nitrogen-containing 5-membered aromatic heterocyclic group bonded through a carbon atom, or a nitrogen-containing 6-membered aromatic heterocyclic group bonded through a carbon atom, still more preferably a substituted aryl group bonded through a carbon atom.

The group bonded through a nitrogen atom is preferably a substituted amino group, or a nitrogen-containing aromatic heterocyclic group bonded through a nitrogen atom, more preferably a nitrogen-containing heterocyclic group bonded through a nitrogen atom, still more preferably a substituted carbazole, a substituted pyrrole or a substituted indole.

The group bonded through a phosphorus atom is preferably a substituted phosphino group. The group bonded through a silicon atom is preferably a substituted silyl group. The group bonded through an oxygen atom is preferably an oxy group or a substituted oxy group. The group bonded through a sulfur atom is preferably a thiole group or a substituted thiole group.

$L_1$ and $L_2$ each represents a linking group which may have a substituent. The linking group is a linking group comprising carbon, nitrogen, silicon, sulfur, oxygen, germanium, phosphorus or the like, preferably a substituted or unsubstituted carbon atom, a substituted or unsubstituted nitrogen atom, a substituted silicon atone an oxygen atom, a sulfur atom, a divalent aromatic hydrocarbon cyclic group or a divalent aromatic heterocyclic group, more preferably a single bond, a substituted or unsubstituted carbon atom, a substituted or unsubstituted nitrogen atom, a substituted silicon atom, a divalent aromatic hydrocarbon cyclic group or a divalent aromatic heterocyclic group, still more preferably a substituted or unsubstituted alkylene group. Examples of the divalent linking group include, but are not limited to, the followings.

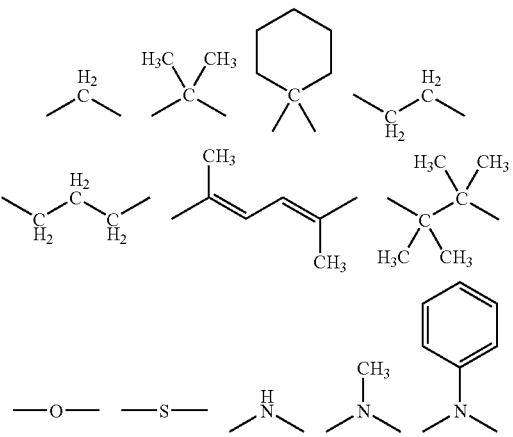

-continued

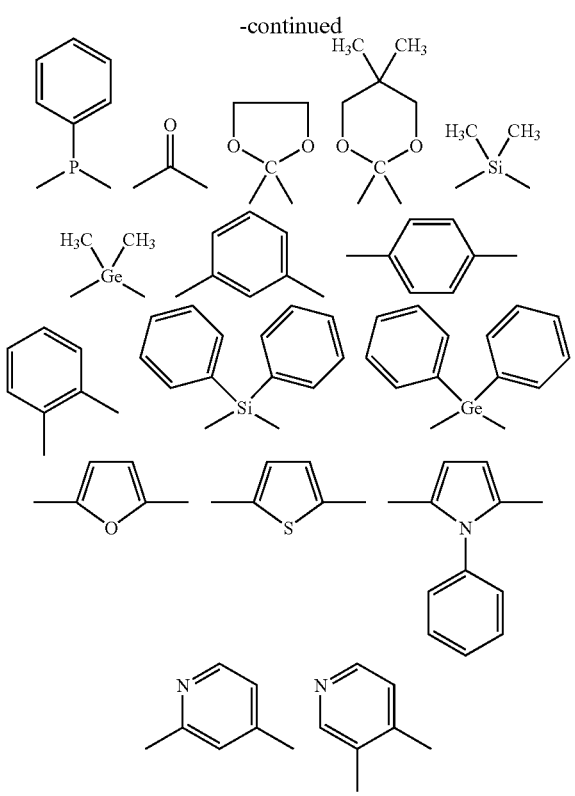

When $L_1$ and $L_2$ each can be substituted, $L_1$ and 14 each may have a substituent. The substituent has the same meaning as the substituent described above for $Q_1$, $Q_2$, $Q_3$ and $Q_4$ when the atomic group constituting the unsaturated ring has a substituent, n represents 0 or 1, and n is preferably 1. When n is 0, this means that the unsaturated ring formed by $Q_1$ or $Q_4$ together with the carbon atom or the unsaturated ring formed by $Q_2$ or $Q_3$ together with the nitrogen atom is not bonded to $A_1$.

$A_2$ represents a partial structure containing an atom bonded to the platinum atom.

The partial structure of $A_2$ is preferably a group coordinate-bonded through a nitrogen atom, a group coordinate-bonded through a phosphorus atom, a group coordinate-bonded through an oxygen atom or a group coordinate-bonded through a sulfur atom, more preferably a group coordinate-bonded through a nitrogen atom, a phosphorus atom or a sulfur atom, still more preferably a group coordinate-bonded through a nitrogen atom or a phosphorus atom, yet still more preferably a group coordinate-bonded through a nitrogen atom.

The group coordinate-bonded through a nitrogen atom is preferably a substituted amino group, or a nitrogen-containing heteroaryl group coordinate-bonded through a nitrogen atom, more preferably a nitrogen-containing 6-membered heterocyclic heteroaryl group coordinate-bonded through a nitrogen atom, still more preferably a substituted pyridine ring.

The group coordinate-bonded through a phosphorus atom is preferably a substituted phosphino group. The group coordinate-bonded through an oxygen atom is preferably a substituted oxy group. The group coordinate-bonded through a sulfur atom is preferably a substituted sulfide group.

The bond between $A_1$ and platinum or between $A_2$ and platinum may be any bond. In the case where $A_1$ or $A_2$ is a coordinating molecule, the bond to the platinum atom is shown by a dotted line and represents a coordinate bond. In the case where $A_1$ or $A_2$ is a coordinating group, the bond to the platinum atom is shown by a solid line and represents a covalent bond.

The coordinate bond is described in detail, for example, in Genetsu Matsubayashi, Hideo Kurosawa, Masaaki Haga and Takayuki Matsushita, *Sakutai-Yuki Kinzoku no Kagaku* (*Chemistry of Complex-Organometallics*), pp. 32-35, Maruzene, and Kiso Sakutai Kogaku Kenkyu Kai (compiler), *Shin-Han Sakutai Kagak, Kiso to Saishin no Tenkaii* (*New Edition, Complex Chemistry, Basis and Latest Development*), page 11, Kodansha Scientific.

The preferred range of formula (I) is described below. The compound of formula (I) is preferably a compound represented by formula (VII).

The compound represented by formula (VII) is described in detail below.

In formula (VII), $R_1$, $R_2$ and $R_3$ each independently represents a substituent. Examples of the substituent are the same as those described above for $Q_1$, $Q_2$, $Q_3$ and $Q_4$ when the atomic group constituting the unsaturated ring has a substituent.

$R_1$ is preferably an alkyl group, a cycloalkyl group, an aryl group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amide group, a hydroxy group, a mercapto group, a halogen atom, a cyano group, a sulfo group, a carboxyl group, a nitro group, a sulfino group, a heterocyclic group or a silyl group. Preferred examples of these groups are the same as preferred groups described above for the substituent. $R_1$ is more preferably an alkyl group, an aryl group, a sulfonyl group, a halogen atom, a cyano group, a nitro group or a heterocyclic group, and most preferably an alkyl group, an aryl group, a halogen atom or a cyano group.

$R_2$ and $R_3$ each is preferably an alkyl group, a cycloalkyl group, an aryl group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amide group, a hydroxy group, a mercapto group, a halogen atom, a cyano group, a sulfo group, a carboxyl group, a nitro group, a sulfino group, a heterocyclic group or a silyl group. Preferred examples of these groups are the same as preferred groups described above for the substituent $R_2$ and $R_3$ each is more preferably an alkyl group, a cycloalkyl group, an aryl group, an alkoxy group or an aryloxy group, still more preferably a substituted or unsubstituted allyl group or a substituted or unsubstituted alkoxy group.

When $R_1$, $R_2$ and $R_3$ each represents a substituent and can be further substituted, the substituent may have a substituent. Each pair of $R_1$ and $R_1$, $R_2$ and $R_2$, $R_3$ and $R_3$, $R_1$ and $R_2$, and $R_1$ and $R_3$ may combine with each other to form a ring.

In formula (VII), p1, p2 and p3 each independently represents an integer of 0 to 3, preferably from 0 to 2, more preferably 0 or 1. When p1 to p3 each is 2 or more, multiple $R_1$s, $R_2$s or $R_3$s may be the same or different, and $R_1$s, $R_2$s or $R_3$s may combine with each other to form a ring. When p1 is 0, the benzene ring have no $R_1$, and when p2 and p3 each is 0, the pyridine rings has no $R_2$ and $R_3$. (That is, when p1 to p3 each is 0, the benzene and pyridine rings have a hydrogen atom for $R_1$, $R_2$ and $R_3$.) $L_1$, $n_2$, n and $A_1$ have the same meanings as $L_1$, $L_2$, n and $A_1$ in formula (I), and preferred examples thereof are the same as preferred examples of $L_1$, $L_2$, n and $A_1$ described above in formula (I).

The preferred range of formula (II) is described below. The compound of formula (II) is preferably a compound represented by formula (VIII).

Formula (VIII) is described in detail below.

In formula (VI), $R_1$, $R_2$, $R_3$, p1, p2 and p3 have the same meanings as $R_1$, $R_2$, $R_3$, p1, p2 and p3 in formula (V), and preferred examples thereof are the same as preferred examples of $R_1$, $R_2$, $R_3$, p1, p2 and p3 described above in formula (VI).

$L_1$, $L_2$, n and $A_1$ have the same meanings as $L_1$, La, n and $A_1$ in formula (I), and preferred examples thereof are the same as preferred examples of $L_1$, $L_2$, n and $A_1$ described above in formula (I).

The preferred range of formula (III) is described below. The compound of formula (III) is preferably a compound represented by formula (IX).

Formula (IX) is described in detail below.

In formula (IX), $R_1$, $R_2$, $R_3$, p1, p2 and p3 have the same meanings as $R_1$, $R_2$, $R_3$, p1, p2 and p3 in formula (VII), and preferred examples thereof are the same as preferred examples of $R_1$, $R_2$, $R_3$, p1, p2 and p3 described above in formula (VII). $L_1$, $L_2$, n and $A_1$ have the same meanings as $L_1$, $L_2$, n and $A_1$ in formula (I), and preferred examples thereof are the same as preferred examples of $L_1$, $L_2$, n and $A_1$ described above in formula (I).

The preferred range of formula (IV) is described below. The compound of formula (IV) is preferably a compound represented by formula (X).

Formula (X) is described in detail below.

In formula (X), $R_1$, $R_2$, p1 and p2 have the same meanings as $R_1$, $R_2$, p1 and p2 in formula (VII), and preferred examples thereof are the same as preferred examples of $R_1$, $R_2$, p1 and p2 described above in formula (VII). $R_4$ represents a substituent, and examples of the substituent are the same as those described above for $Q_1$, $Q_2$, $Q_3$ and $Q_4$ when the atomic group constituting the unsaturated ring has a substituent.

$R_4$ is preferably an alkyl group, a cycloakyl group, an aryl group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amide group, a hydroxy group, a mercapto group, a halogen atom, a cyano group, a sulfo group, a carboxyl group, a nitro group, a sulfino group, a heterocyclic group or a silyl group. Preferred examples of these groups are the same as preferred groups described above for the substituent. $R_4$ is more preferably an alkyl group, an aryl group, a sulfonyl group, a halogen atom, a cyano group, a nitro group or a heterocyclic group, and most preferably an alkyl group, an aryl group, a halogen atom or a cyano group, In formula (X), p4 represents an integer of 0 to 3, preferably from 0 to 2, more preferably 0 or 1. In formula (X), when p1, p2 and p4 each is 2 or more, multiple $R_1$s, $R_2$s or $R_4$s may be the same or different and $R_1$s, $R_2$s or $R_4$s may combine with each other to form a ring. When p1 and P4 is 0, the benzene ring has no $R_1$ and 1, and when p2 is 0, the pyridine ring has no $R_2$ and $R_3$. (That is, when p1, p2 and p4 each is 0, the benzene and pyridine rings have a hydrogen atom for $R_1$, $R_2$ and $R_4$.)

$L_1$, $L_2$ and n have the same meanings as $L_1$, $L_2$ and n in formula (I), and preferred examples thereof are the same as preferred examples of $L_1$, $L_2$ and n described above in formula (I). $A_2$ has the same meaning as $A_2$ in formula (IV), and examples thereof are also the same.

The preferred range of formula (V) is described below. The compound of formula (V) is preferably a compound represented by formula (XI).

Formula (XI) is described in detail below.

In formula (XI), $R_1$, $R_2$, p1 and p2 have the same meanings as $R_1$, $R_2$, p1 and p2 in formula (VII), and preferred examples thereof are the same as preferred examples of $R_1$, $R_2$, p1 and p2 described above in formula (VII). $R_4$ represents a substituent, and examples of the substituent are the same as those described above for $Q_1$, $Q_2$, $Q_3$ and $Q_4$ when the atomic group constituting the unsaturated ring has a substituent. $R_4$ and p4 have the same meanings as $R_4$ and p4 in formula (X), and preferred ranges of 1 and p4 are the same as preferred ranges of $R_4$ and p4 described above in formula (X). $L_1$, $L_2$ and n have the same meanings as $L_1$, $L_2$ and n in formula (I), and preferred examples thereof are the same as preferred examples of $L_1$, $L_2$ and n described above in formula (I). A has the same meaning as $A_2$ in formula (IV), and examples thereof are also the same.

The preferred range of formula (VI) is described below. The compound of formula (VI) is preferably a compound represented by formula (XII).

Formula (XII) is described in detail below.

In formula (XII), $R_1$, $R_2$, p1 and p2 have the same meanings as $R_1$, $R_2$, p1 and p2 in formula (VII), and preferred examples thereof are the same as preferred examples of $R_1$, $R_2$, p1 and p2 described above in formula (VII). $R_4$ represents a substituent, and examples of the substituent are the same as those described above for $Q_1$, $Q_2$, $Q_3$ and $Q_4$ when the atomic group constituting the unsaturated ring has a substituent. $R_4$ and p4 have the same meanings as $R_4$ and p4 in formula (X), and preferred ranges of $R_4$ and p4 are the same as preferred ranges of $R_4$ and p4 described above in formula (X). $L_1$, $L_2$ and n have the same meanings as $L_1$, $L_2$ and n in formula (I), and preferred examples thereof are the same as preferred examples of $L_1$, $L_2$ and n described above in formula (I). $A_2$ has the same meaning as $A_2$ in formula (IV), and examples thereof are also the same.

The compounds of the present invention may be a low molecular compound or may be an oligomer compound or a polymer compound (the weight average molecular weight (polystyrene-reduced) is preferably from 1,000 to 5,000,000, more preferably from 2,000 to 1,000,000, still more preferably from 3,000 to 100,000). In the case of a polymer compound, the structure represented by formulae (X) to (XII) may be contained in the polymer main chain or in the polymer side chain. Also, in the case of a polymer compound, the compound may be a homopolymer compound or a copolymer. The compounds of the present invention are preferably a low molecular compound.

The compounds of the present invention are applicable to an organic EL device and can be used for any of an electron-transporting material a hole blocking material, an electron blocking material and an exciton blocking material but is preferably used for a hole-injecting material, a hole-transporting material, an electron blocking material or a light-emitting material, more preferably for a hole-injecting material or a light-emitting material, still more preferably for a light-emitting material. In the case of using the compound of the present invention as the light-emitting material, the light emission may be ultraviolet emission, visible light emission or infrared emission and may be fluorescence or phosphorescence.

Examples of the compounds of the present invention are set forth below, but the present invention is not limited thereto.
(1)
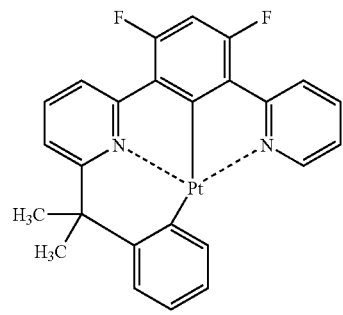
(2)
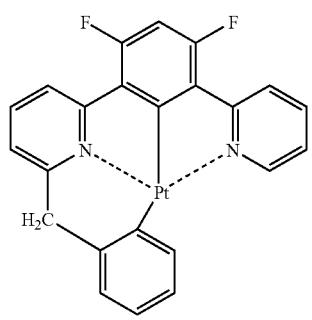
(3)
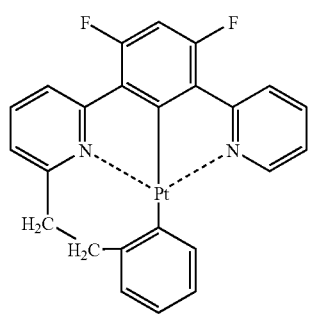
(4)
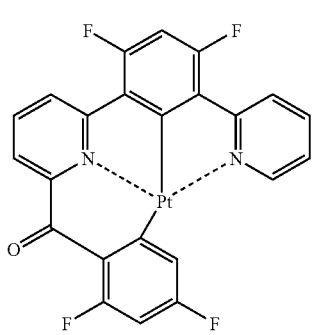
-continued
(5)
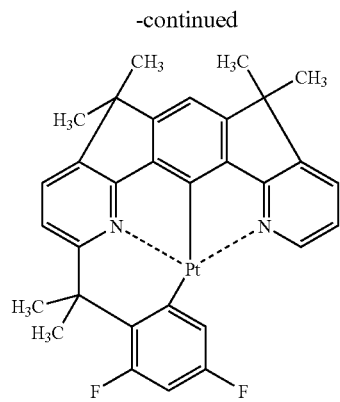
(6)
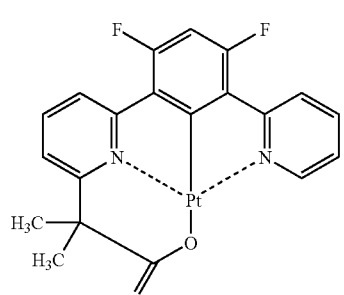
(7)
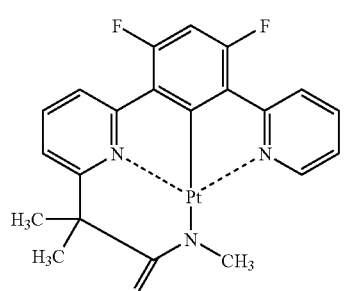
(8)
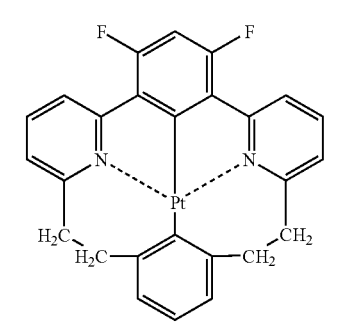
(9)
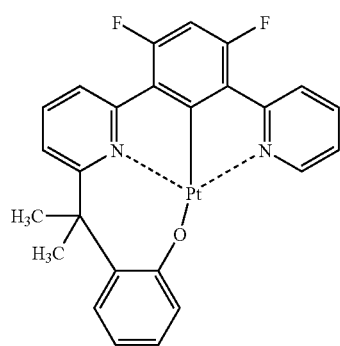

-continued
(10)
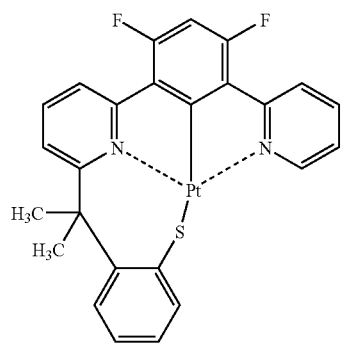
(11)
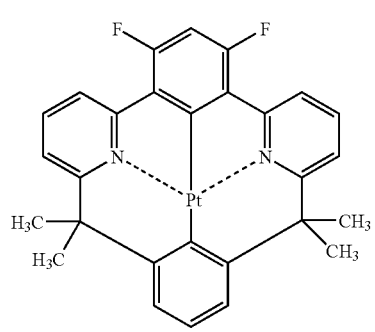
(12)
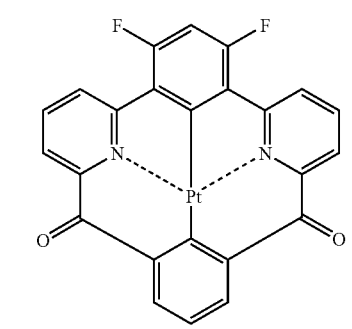
(13)
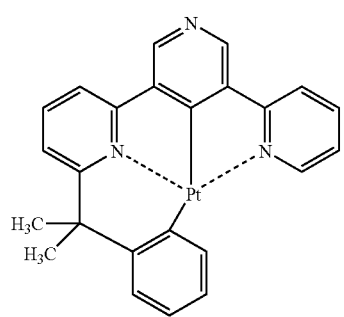
(14)
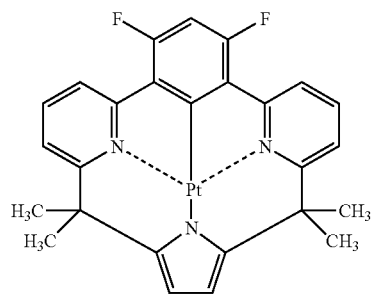
-continued
(15)
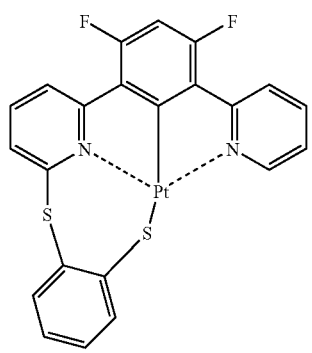
(16)
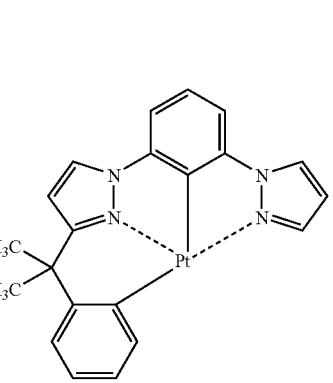
(17)
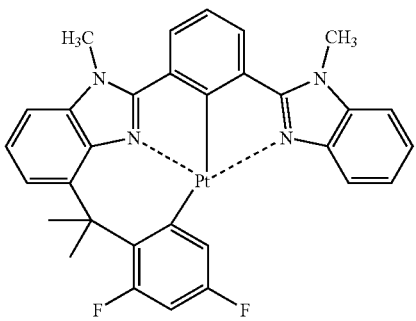
(18)
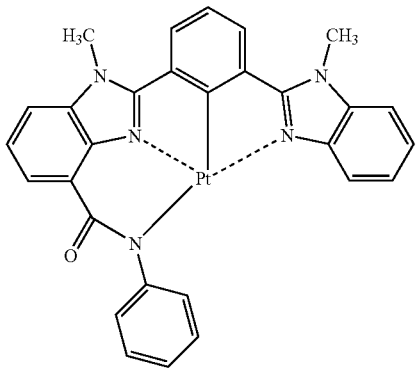

-continued
(19)
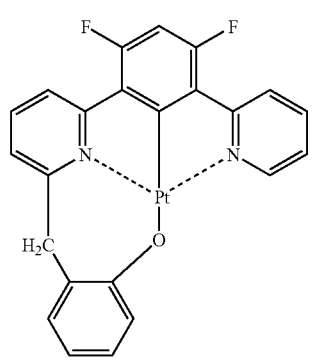
(20)
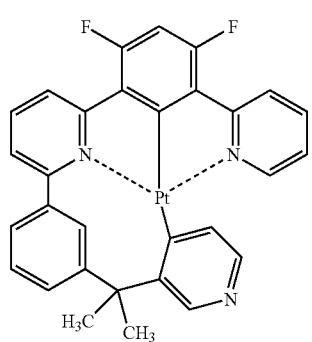
(21)
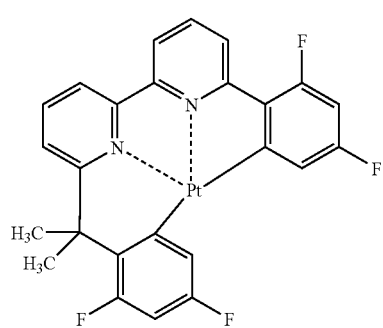
(22)
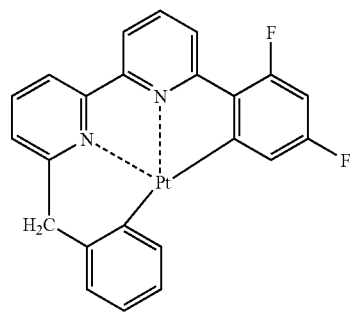
(23)
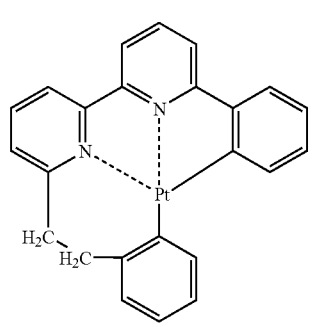
-continued
(24)
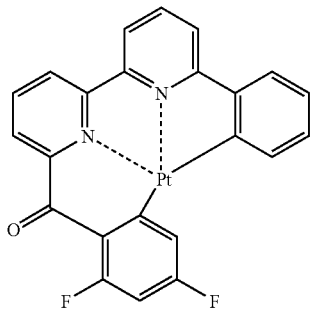
(25)
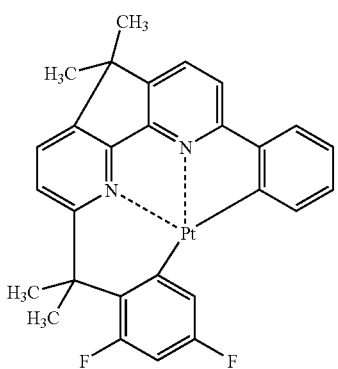
(26)
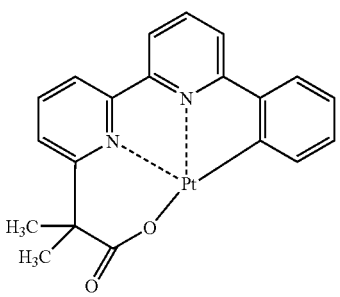
(27)
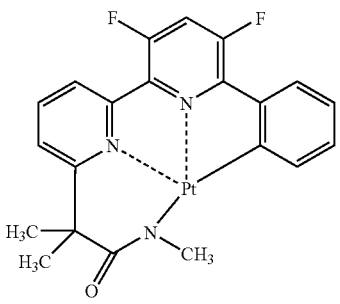
(28)
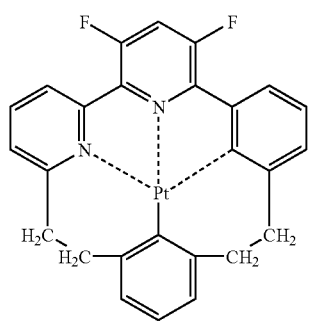

(29)
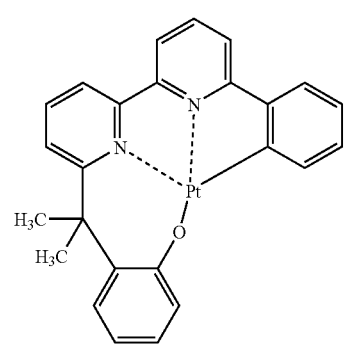
(30)
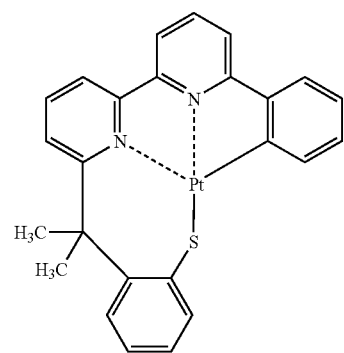
(31)
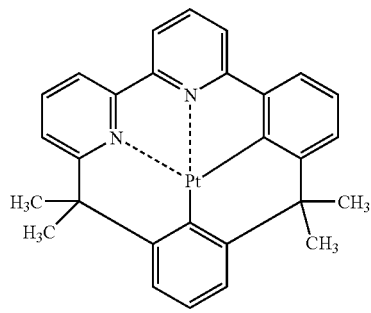
(32)
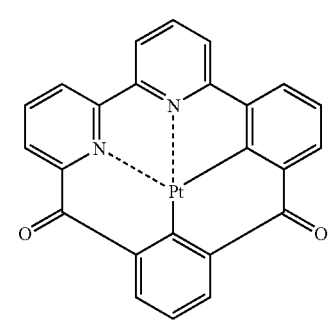
(33)
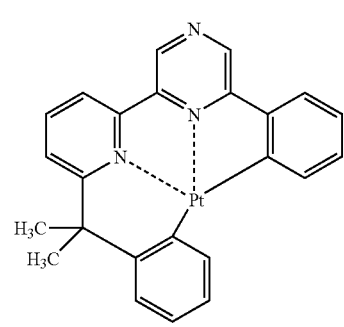
(34)
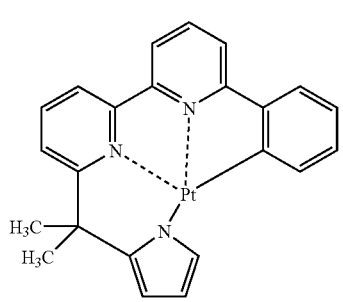
(35)
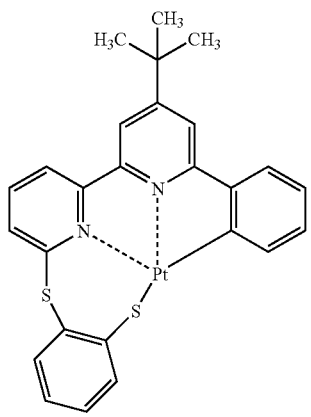
(36)
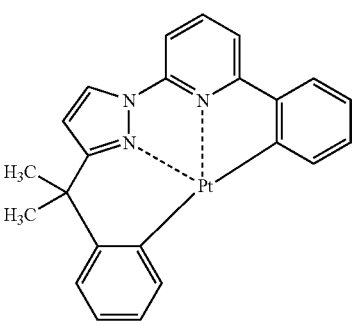
(37)
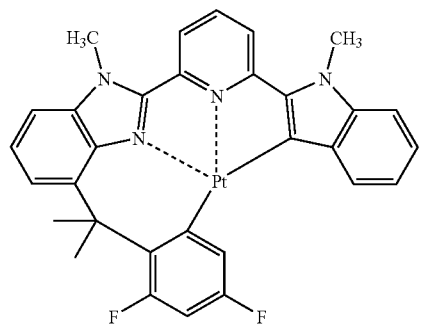

-continued
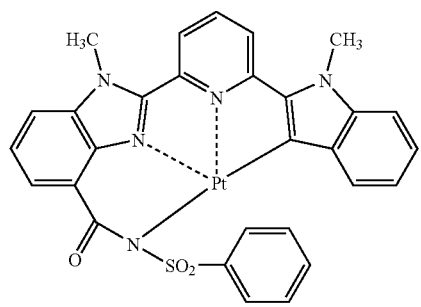
(38)
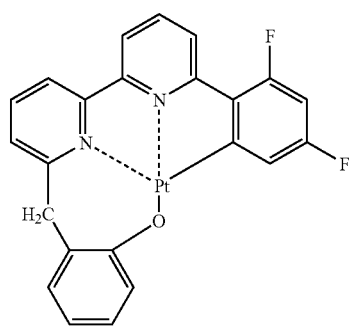
(39)
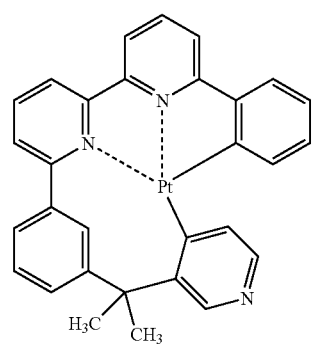
(40)
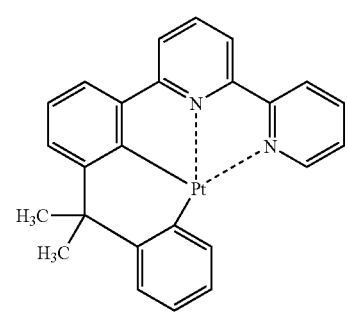
(41)
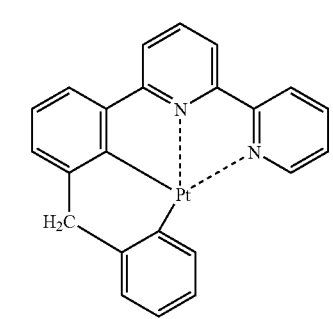
(42)
-continued
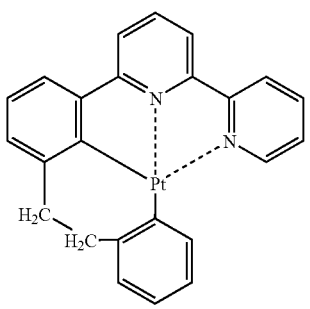
(43)
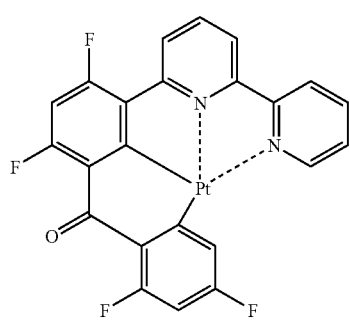
(44)
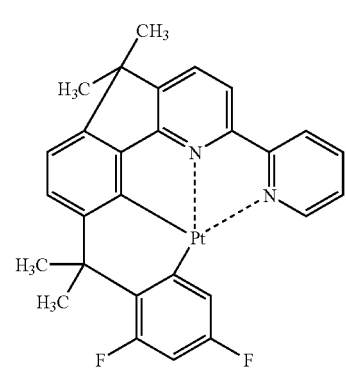
(45)
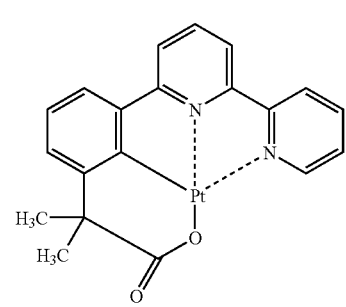
(46)
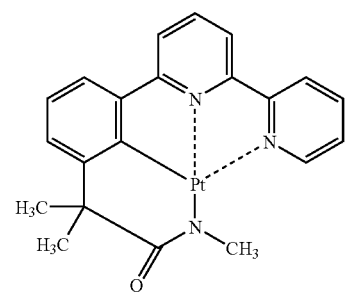
(47)

-continued
(48)
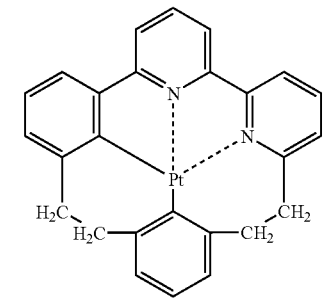
(49)
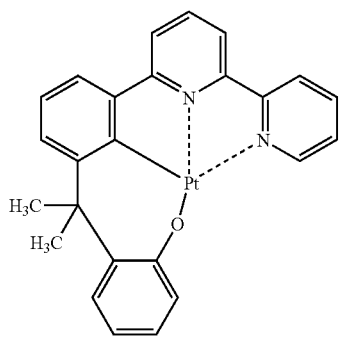
(50)
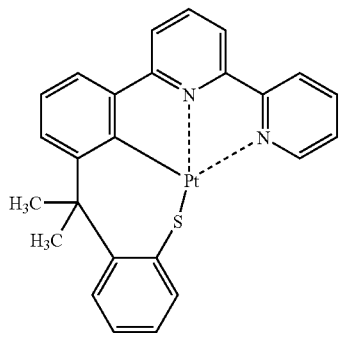
(51)
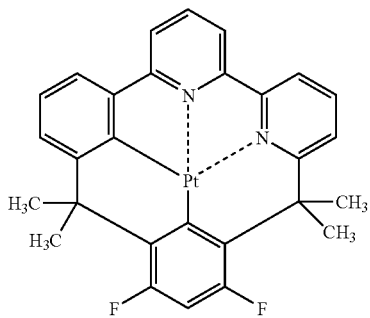
(52)
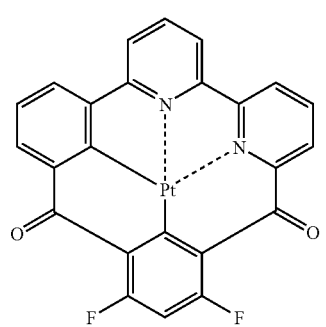
-continued
(53)
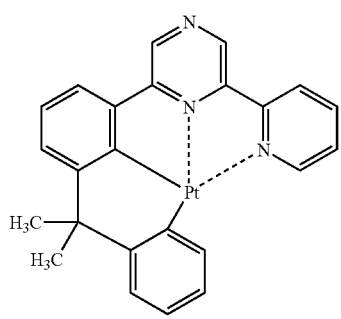
(54)
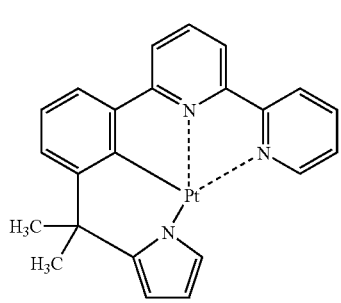
(55)
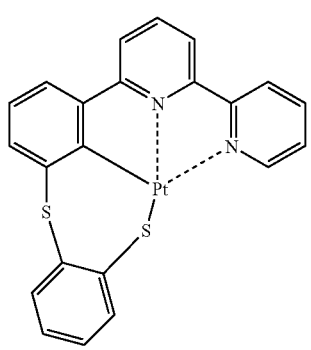
(56)
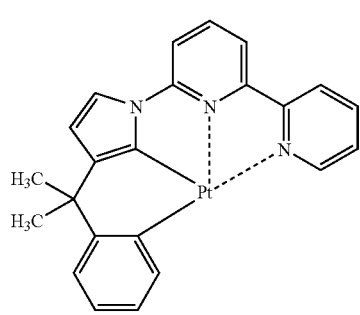
(57)
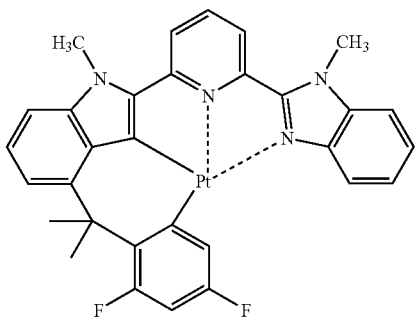

(58)
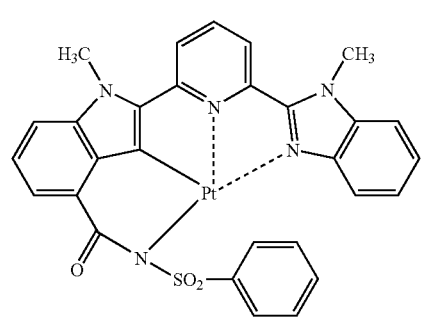
(59)
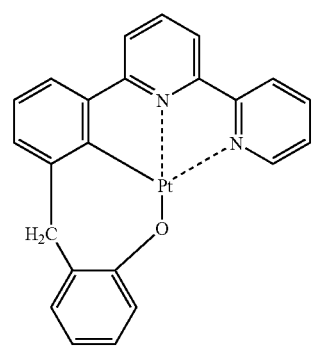
(60)
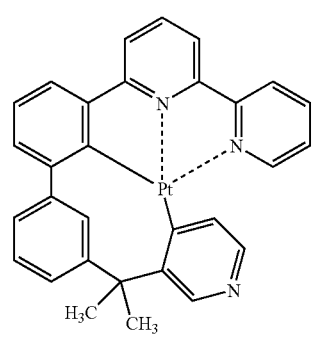
(61)
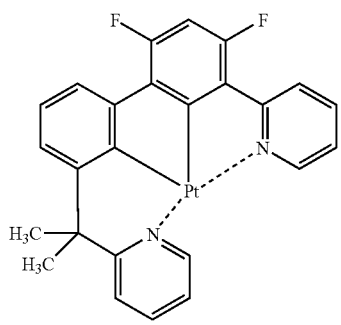
(62)
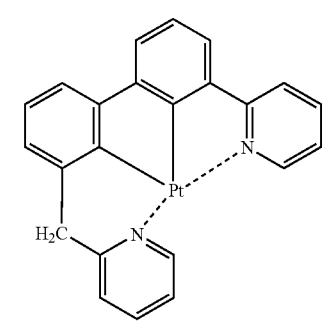
(63)
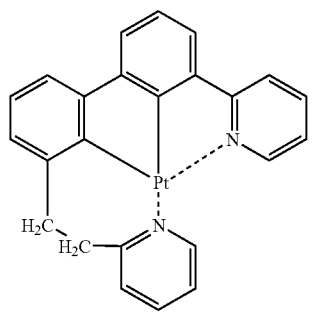
(64)
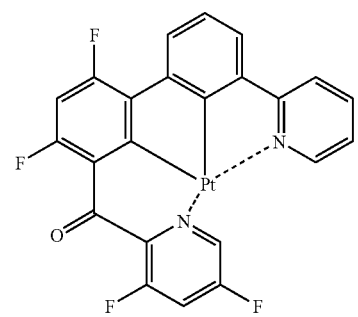
(65)
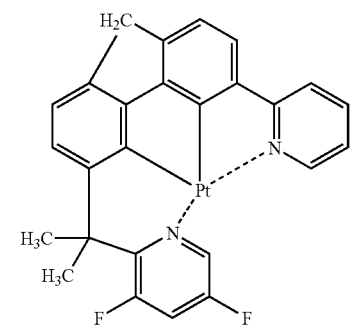
(66)
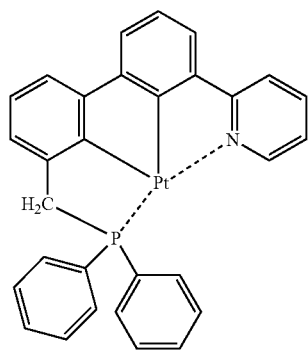

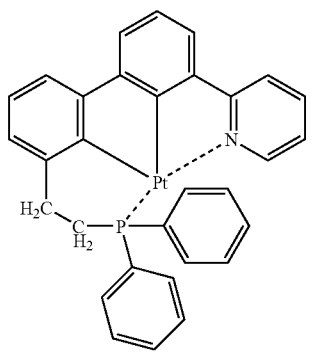
(67)
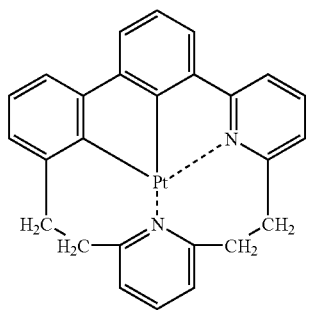
(68)
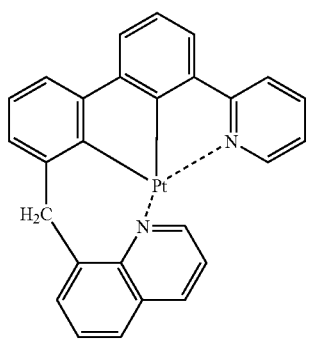
(69)
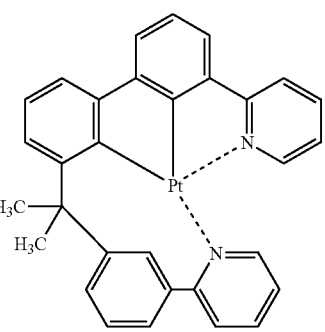
(70)
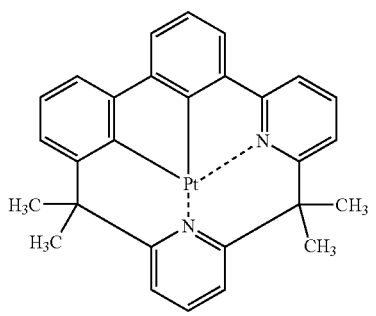
(71)
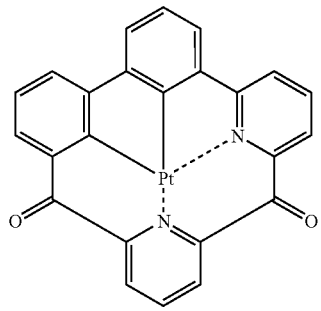
(72)
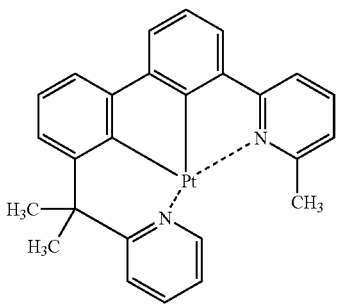
(73)
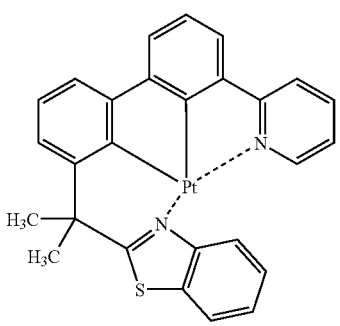
(74)
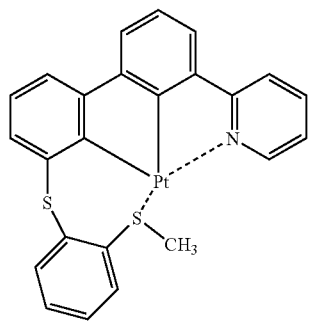
(75)

-continued
(76) 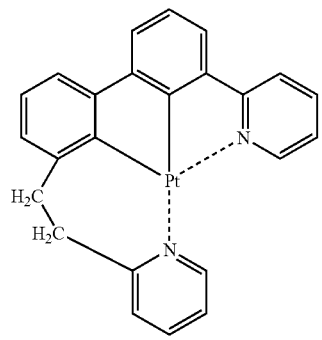
(77) 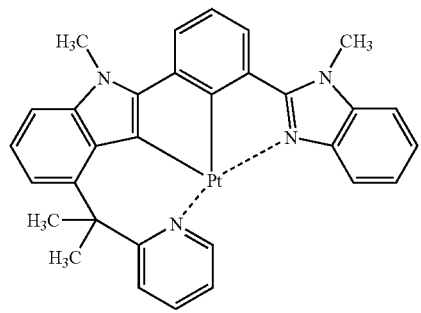
(78) 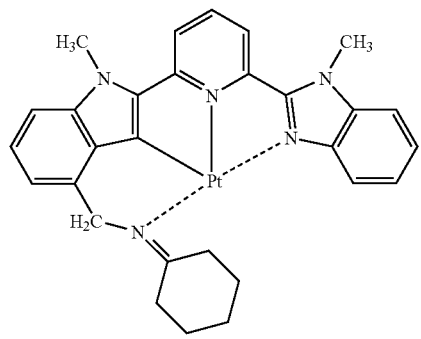
(79) 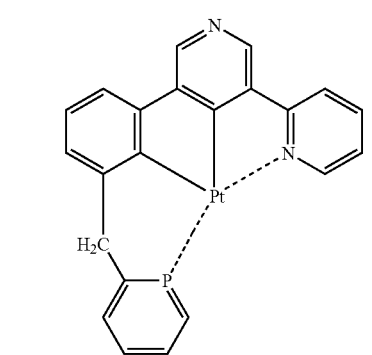
-continued
(80) 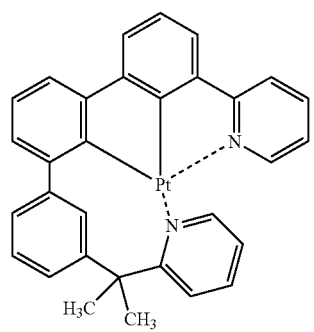
(81) 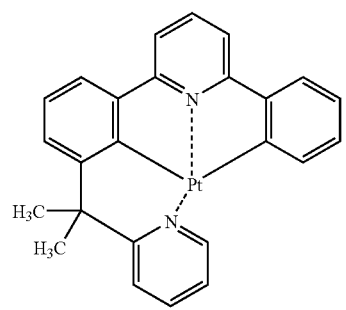
(82) 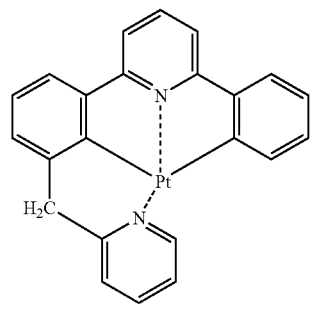
(83) 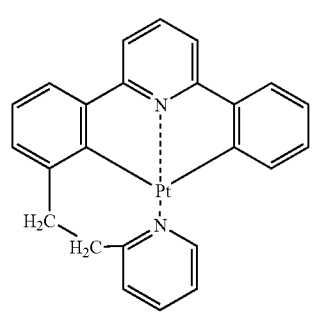
(84) 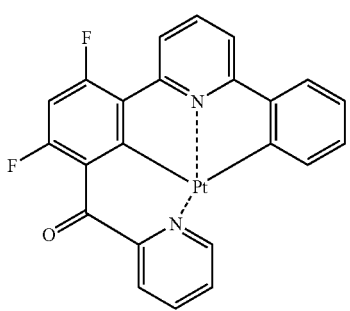

(85) 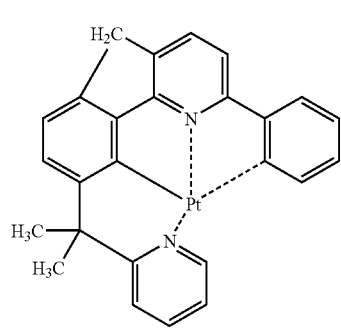
(86) 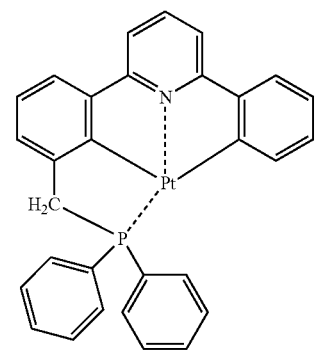
(87) 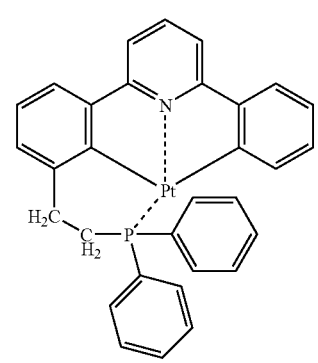
(88) 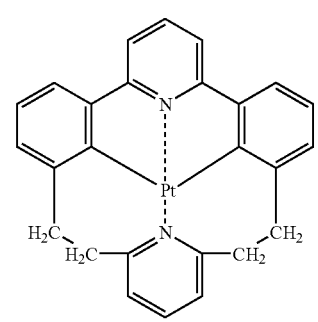
(89) 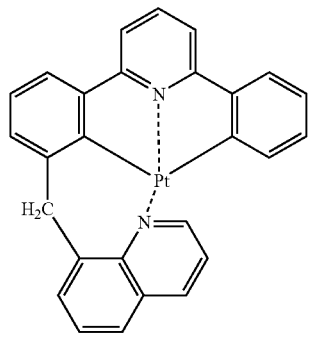
(90) 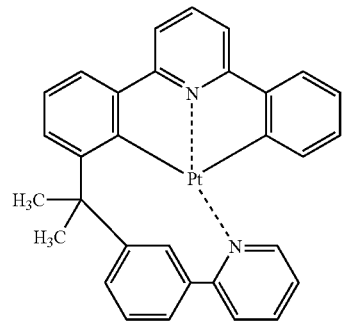
(91) 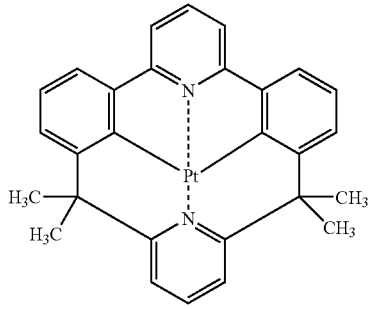
(92) 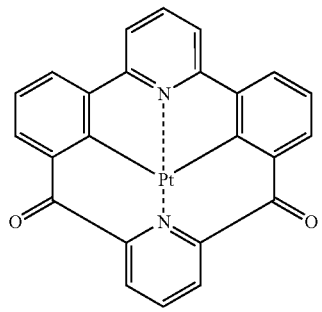
(93) 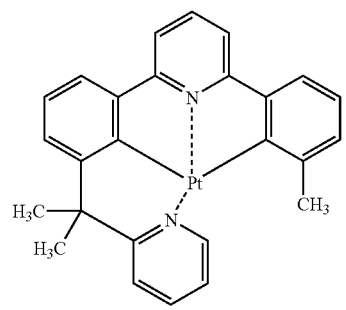

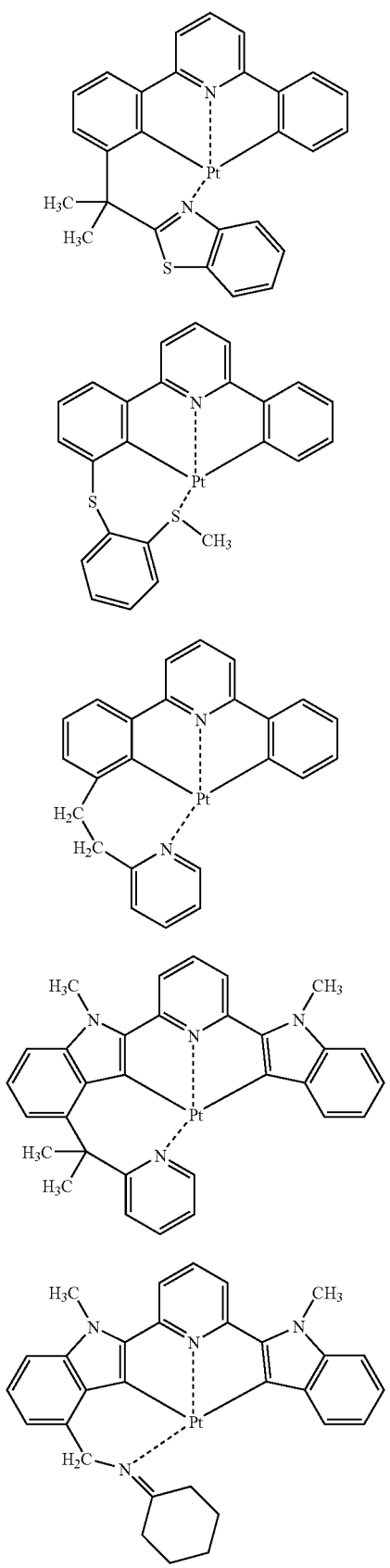
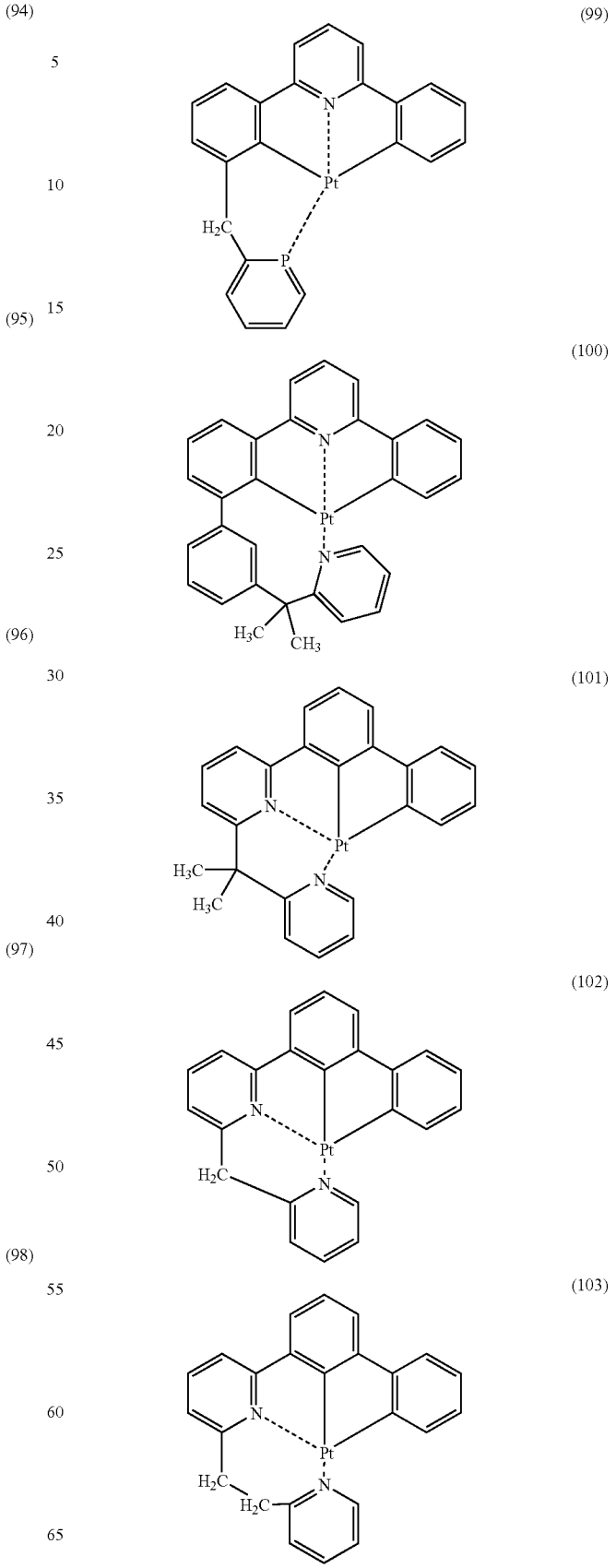

-continued
(104) 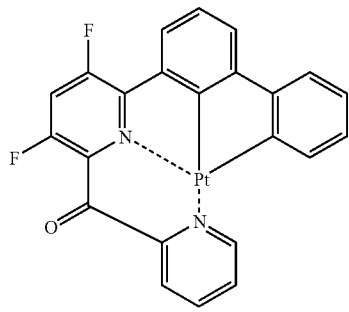
(105) 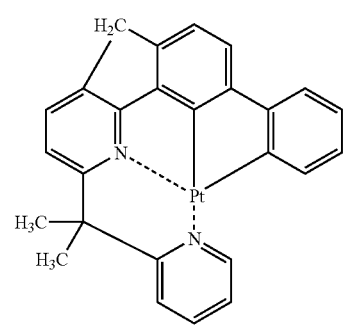
(106) 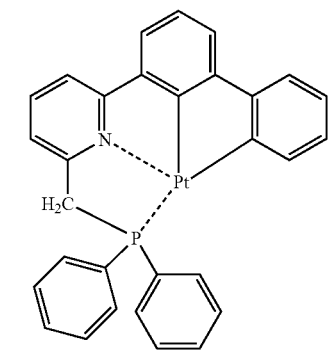
(107) 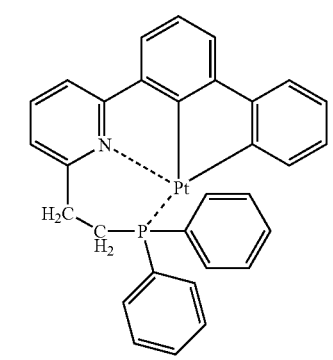
-continued
(108) 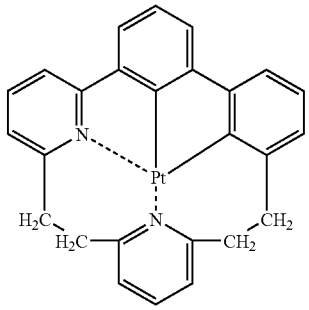
(109) 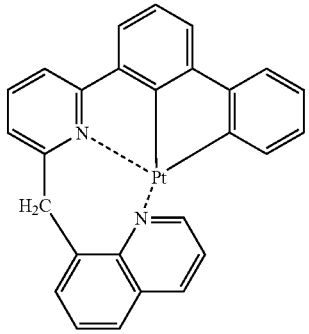
(110) 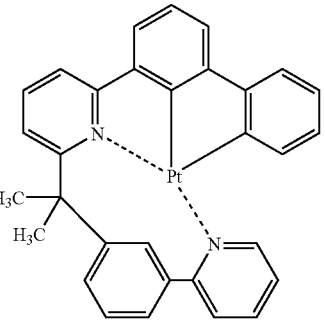
(111) 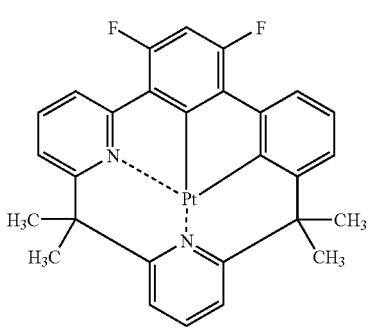
(112) 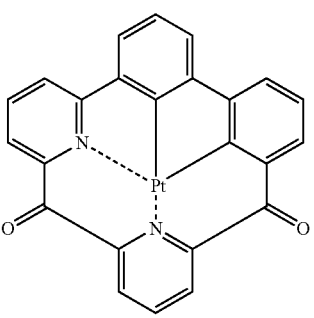

-continued
(113) 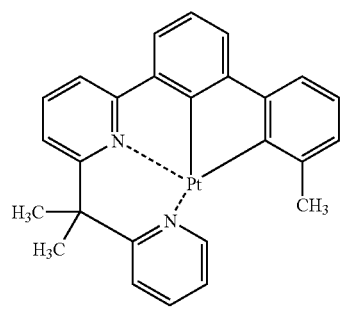
(114) 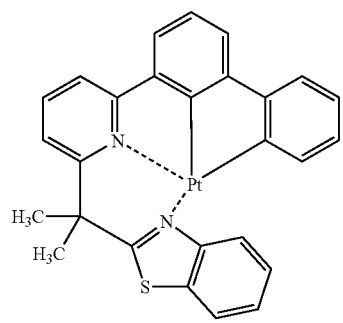
(115) 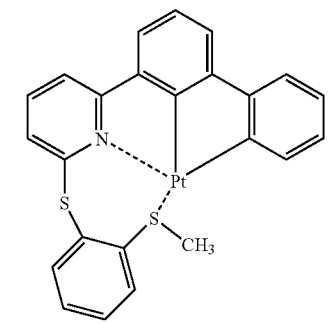
(116) 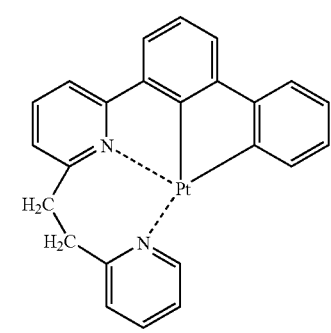
(117) 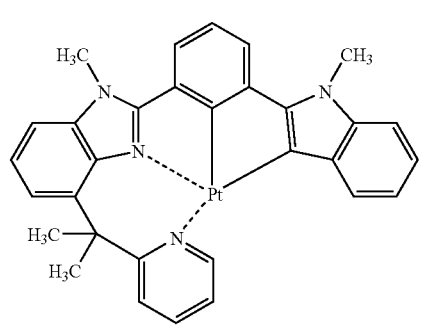
-continued
(118) 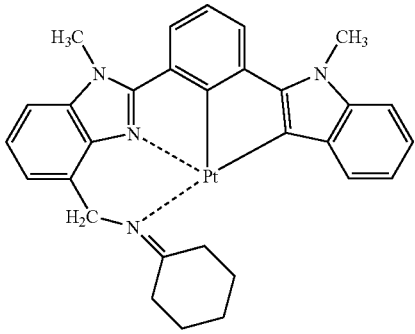
(119) 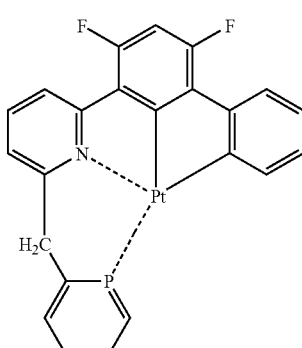
(120) 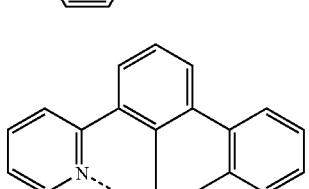
(121) 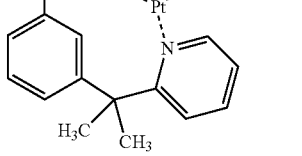
(122) 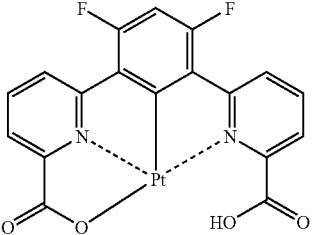

-continued
(123)
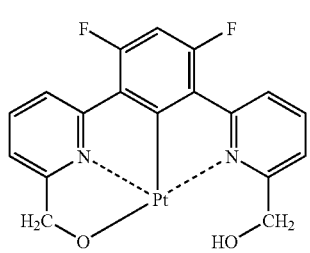
(124)
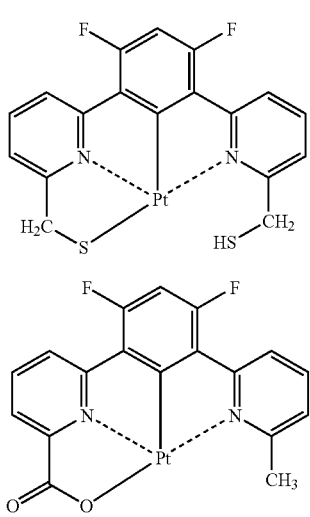
(125)
(126)
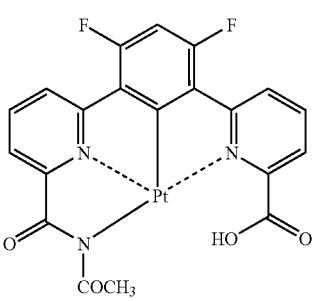
(127)
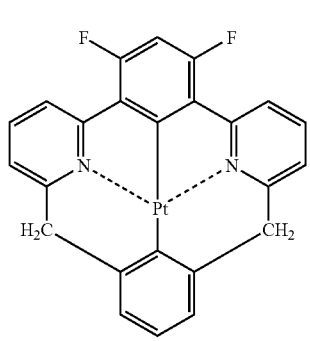
-continued
(128)
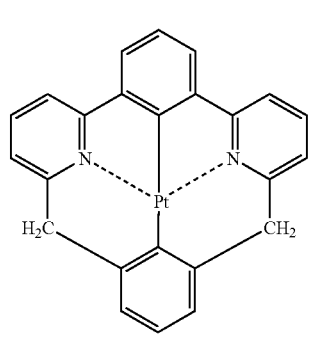
(129)
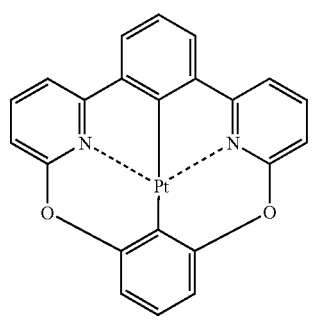
(130)
(131)
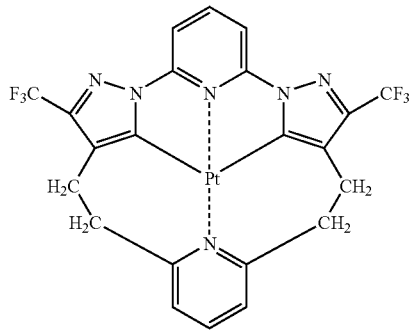

-continued (132) 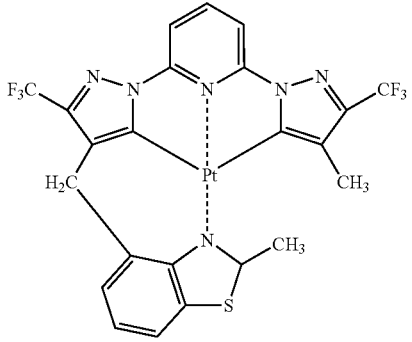

(133)

(134) 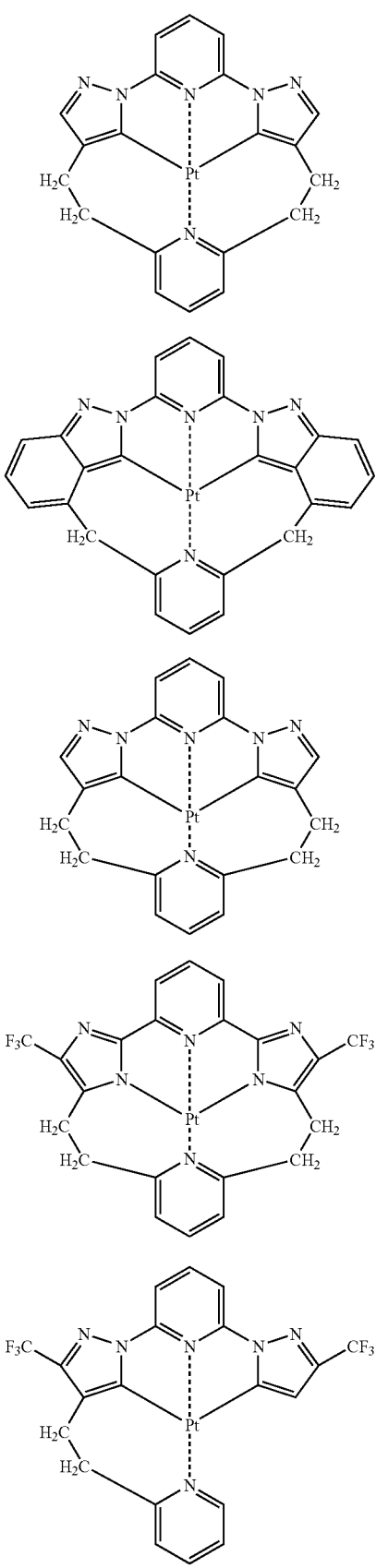

(135)

(136)

-continued (137) 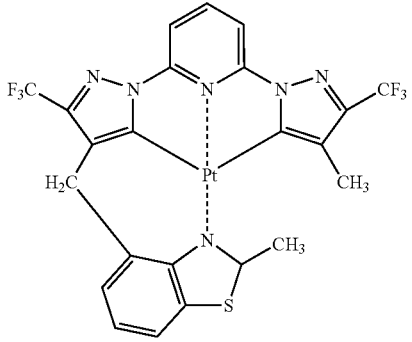

(138) 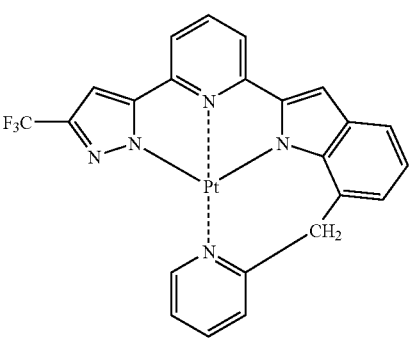

(139) 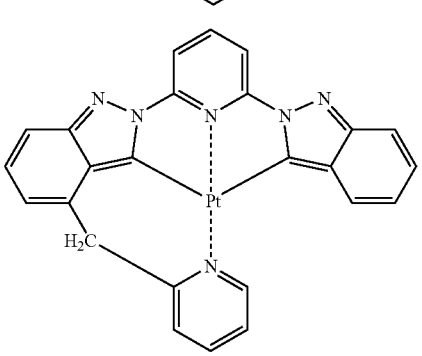

(140) 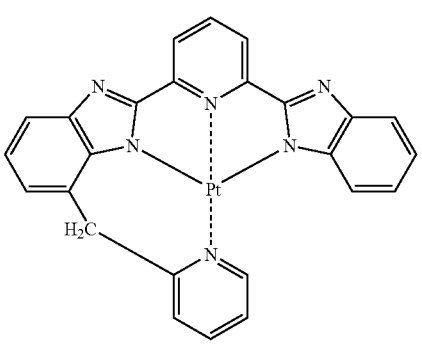

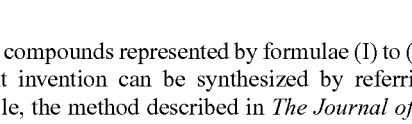

The compounds represented by formulae (I) to (XII) of the present invention can be synthesized by referring to, for example, the method described in *The Journal of American Chemical Society*, 117, 8447 (1995) or *Organometallics*, 18, 3337 (1999).

The compounds represented by formulae (I) to (XII) of the present invention can be synthesized by various techniques. For example, a compound containing a ligand or a dissociation product thereof and a metal ion can be obtained in the presence or absence of a solvent (examples of the solvent include a halogen-based solvent, an alcohol-based solvent, an ether-based solvent, an ester-based solvent, a ketone-based solvent, a nitrile-based solvent, an amide-based solvent, a sulfone-based solvent, a sulfoxide-based solvent and water), in the presence or absence of a base (examples of the base include various inorganic or organic bases such as sodium methoxide, potassium tert-butoxide, triethylamine and potassium carbonate), and at room temperature or less or under heating (other than normal heating, microwave heating is also effective).

In the synthesis of the compounds represented by formulae (I) to (XII) of the present invention, the reaction time varies depending on the activity of reaction and is not particularly limited but is preferably from 1 minute to 5 days, more preferably from 5 minutes to 3 days, still more preferably from 10 minutes to 24 hours.

In the synthesis of the compounds represented by formulae (I) to (XII) of the present invention, the reaction temperature vies depending on the activity of reaction and is not particularly limited but is preferably from 0 to 300° C., more preferably from 5 to 250° C., still more preferably from 10 to 200° C.

The compounds represented by formulae (I) to (XII) of the present invention can be synthesized by adding the ligand constituting the partial structure of the objective complex, at a ratio of preferably from 0.1 to 10 equivalent, more preferably from 0.3 to 6 equivalent, still more preferably from 0.5 to 4 equivalent, based on the metal compound. Examples of the metal compound include a metal halide (e.g., platinum chloride, potassium tetrachloroplatinate), a metal acetate (e.g., platinum acetate), a metal acetyl acetonate (e.g., platinum acetyl acetonate), and a hydrate thereof.

Out of the compounds represented by formula (I) of the present invention, the specific synthesis example of Compound (121) is described below, but the present invention is not limited to this method,

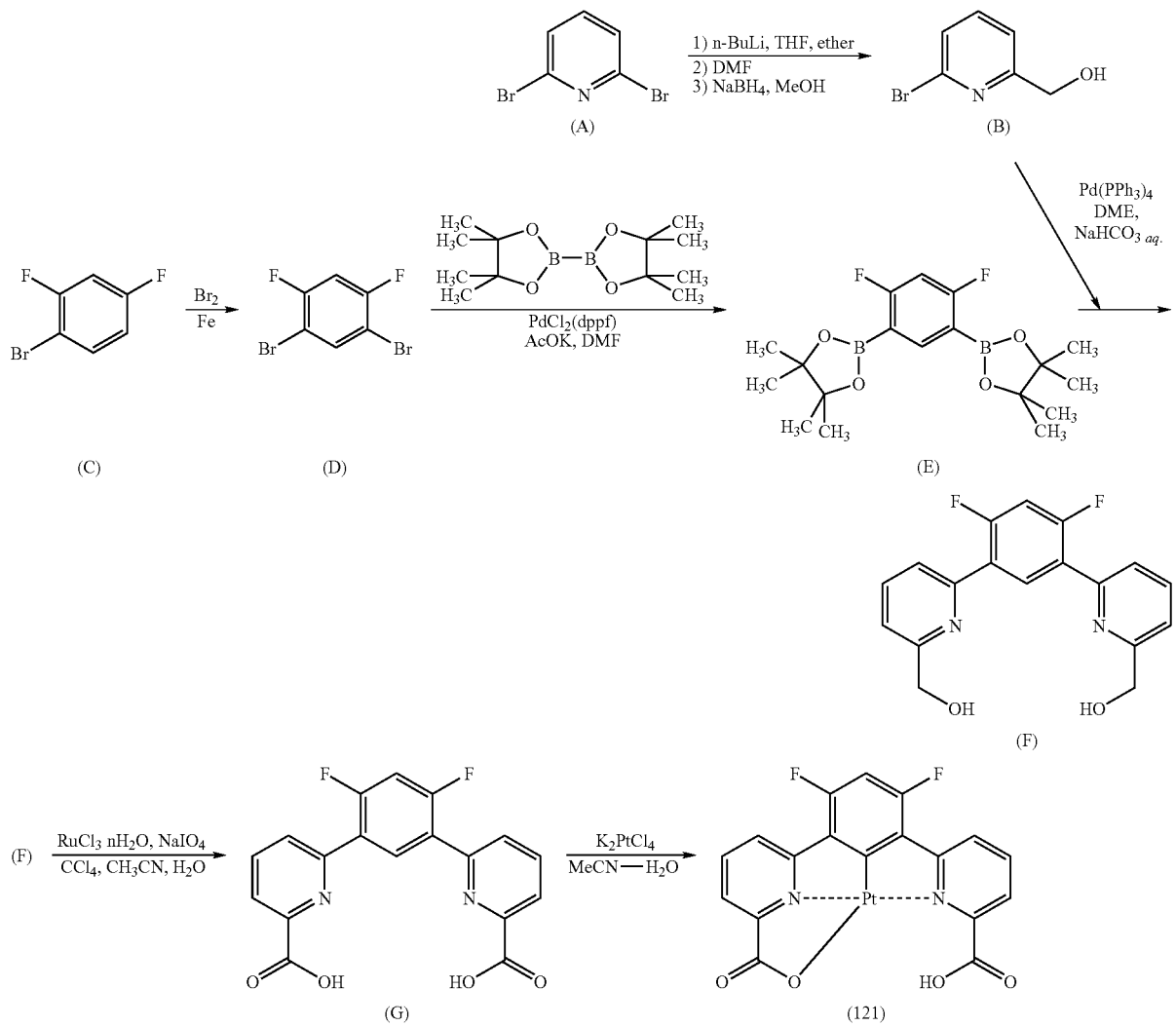

In a 1 liter-volume three-neck flask 25.0 g (106 mmol) of 2,6-dibromopyridine (A), 67 ml of anhydrous tetrahydrofuran and 133 ml of diethyl ether were added and stirred at −78° C. in a nitrogen stream and while continuing stirring, n-butyl lithium (a 1.6 M hexane solution, 65.5 ml, 40.9 mmol) was added dropwise little by little. The resulting solution was stirred at −78° C. for 5 minutes and then 16.75 ml of anhydrous N,N-dimethylformamide was added dropwise little by little. After stirring at −78° C. for one hour) the temperature was elevated to −50° C. and 125 ml of methanol was added. The temperature was ether elevated to room temperature and while siring the solution, 4.06 g (107 mmol) of sodium borohydride was added thereto, followed by stirring at room temperature for 5 hours. Thereafter, the reaction was stopped by adding acetone to the reaction mixture and then water was added. The aqueous layer was extracted with ethyl acetate and the collected organic layer was dried over anhydrous magnesium sulfate. After separating inorganic salts by filtration, the organic layer was concentrated in a rotary evaporator and the residue was purified by silica gel column chromatography to obtain 15.3 g (yield: 77%) of (B).

$^1$H-NMR (300 MHz, in CDCl$_3$) δ=3.22 (br.s, 1H), 4.85 (s, 2H), 7.37 (d, 1H, J=7.7 Hz), 7.46 (d, 1H, J=7.7 Hz), 7.56 (t, 1H, J=7.7 Hz).

In a 1 liter-volume three-neck flask 17.6 ml (17.4 mmol) of 1-bromo-2,4-difluorobenzene (C) and 0.60 g (10.7 mmol) of reduced iron were charged and stirred under heating at 60° C. and while continuing stirring, 24.8 g (18.3 mmol) of bromine was added dropwise little by little over 30 minutes. The stirring was further continued as-is at 60° C. for 5 hours. After the completion of reaction, the mixture was cooled to 0° C. and an aqueous solution of 10% sodium hydroxide was added dropwise little by little. Furthermore, saturated brine was added and the mixture was extracted twice with toluene. The collected organic layer was dried over anhydrous magnesium sulfate. After separating inorganic salts by filtration, the organic layer was concentrated in a rotary evaporator and the obtained residue was purified by silica gel column chromatography to obtain 30.6 g (yield: 72%) of (D).

$^1$H-NMR (300 MHz, in CDCl$_3$) δ=6.98 (t, 1H, J=6.0 Hz), 7.77 (t, 1H, J=6.0 Hz).

In a 300 ml-volume three-neck flask, 4.90 g (18.0 mmol) of (D), 10.1 g (39.6 mmol) of bis(pinacolato)diboron, 200 ml of anhydrous N,N-dimethylformamide and 10.4 g (106 mmol) of potassium acetate were added and stirred in a nitrogen stream and while continuing stirring, 0.86 g (1.05 mmol) of diphenylphosphinoferrocene palladium dichloride was added, followed by stirring at 80° C. for 9 hours. Thereafter, water was added and the aqueous layer was extracted with ethyl acetate. The collected organic layer was dried over anhydrous magnesium sulfate and after separating inorganic salts by filtration, the organic layer was concentrated in a rotary evaporator. The obtained residue was purified by silica gel column chromatography to quantitatively obtain 6.73 g of (E).

$^1$H-NMR (300 MHz, in CDCl$_3$) δ1.36 (s, 24H), 6.73 (t, 1H, J=9.66 Hz), 8.13 (t, 1H, J=7.44 Hz).

In a 300 ml-volume three-neck flask 4.11 g (21.9 mmol) of (B), 4.00 g (10.9 mmol) of (E), 80 ml of 1,2-dimethoxyethane and 60 ml of an aqueous 1M sodium hydrogencarbonate solution were added and stirred in a nitrogen stream and while continuing stirring 0.75 g (0.65 mmol) of tetrakistriphenylphosphine palladium was added, followed by stirring at 80° C. for 9 hours. Thereafter, water and ethyl acetate were added and the aqueous layer was extracted with ethyl acetate. The collected organic layer was dried over anhydrous magnesium sulfate and after separating inorganic salts by filtration, the organic layer was concentrated in a rotary evaporator. The obtained residue was purified by silica gel column chromatography to obtain 1.34 g (yield: 37%) of (F).

$^1$H-NMR (300 MHz, in CDCl$_3$) δ=3.79 (br.s, 2H, —OH), 4.84 (s, 4H), 7.05 (t, 1H, J=10.5 Hz), 7.25 (d, 2H, J=7.5 Hz), 7.69 (br.d, 2H, J=7.5 Hz), 7.793 (t, 2H, J=7.8 Hz), 8.58 (t, 1H, J=9.0 Hz).

In a 100 ml-volume flask, 200 mg (0.609 mmol) of (1), 782 mg (3.67 mmol) of sodium periodidate, a piece of ruthenium trichloride n-hydrate, 4 ml of acetonitrile, 4 ml of carbon tetrachloride and 4 ml of water were added and stirred at room temperature in a nitrogen stream for 3 days. Thereafter, the reaction mixture was diluted with acetonitrile and filtered on Celite. The obtained residue was concentrated in a rotary evaporator and crude crystals were further crystallized from chloroform-hexane to obtain 119 mg (yield: 57%) of (G). The obtained (G) was swiftly used for the next reaction without purifying it any more.

In a 100 ml-volume three-neck flask, 84 mg (0.24 mmol) of (G), 98 mg (0.24 mmol) of potassium chloroplatinate, 10 ml of acetonitrile and 5 ml of water were added and stirred under heating at reflux in a nitrogen stream for 2 days. Thereafter, the crystals produced were separated by filtration and the crude crystals were washed with water, acetonitrile and chloroform to obtain 34 mg (yield: 26%) of sparingly soluble vermilion crystals (121). MS (MALDI-MS, positive), m/z 550, M+1.

The light-emitting device containing the compound of the present invention is described below. The light-emitting device of the present invention can be used for normal light-emitting systems, driving methods and application modes, except that this is a device utilizing the compound of the present invention. Those using the compound represented by formulae (I) to (XII) as the light-emitting material or the hole-injecting material-hole-transporting material are preferred. In the case of using the compound as the light-emitting material, the light emission may be either ultraviolet emission or infrared emission and may be fluorescence or phosphorescence. Representative examples of the light-emitting device include an organic EL (electroluminescent) device.

The light-emitting device of the present invention can be enhanced in the light extraction efficiency by various known techniques. For example, the light extraction efficiency and in turn the external quantum efficiency can be enhanced by processing the surface shape of substrate (for example, forming a pattern of fine asperities), controlling the refractive index of substrate ITO layer organic layer, or controlling the film thickness of substrate ITO layer organic layer.

The light-emitting device of the present invention may employ a so-called top-emission system of taking out the emitted light from the anode side (see, for example, JP-A-2003-208109, JP-A-2003-248441, JP-A-2003-257651 and JP-A-2003-282261).

The substrate for use in the light-emitting device of the present invention is not particularly limited but may be an inorganic material such as zirconia-stabilized yttrium and glass, or high molecular weight materials such as polyester (e.g. polyethylene terephthalate, polybutylene terephthalate, polyethylene naphthalate), polyethylene, polycarbonate, polyethersulfone, polyarylate, allyl diglycol carbonate, polyimide, polycycloolefin, norbornene resin, poly(chlorotrifluoroethylene), Teflon (registered trademark) and polytetrafluoroethylene-polyethylene copolymer.

The organic electroluminescent device of the present invention may contain a blue fluorescent compound, or a multicolor light-emitting device or full color light-emitting device may be produced by using a blue light-emitting device containing a blue fluorescent compound and the light-emitting device of the present invention at the same time.

The light-emitting device of the present invention may have one host material or two or more host materials. The host material is preferably an arylamine (e.g., triphenylamine, benzidine) or a derivative thereof, an aromatic hydrocarbon compound (e.g., triphenylbenzene, triphenylene, phenanthrene, naphthalene, tetraphenylene) or a derivative thereof, an aromatic nitrogen-containing heterocyclic compound (e.g., pyridine, pyrazine, pyrimidine, triazine, pyrazole, imidazole, oxazole, pyrrole) or a derivative thereof, or a metal complex (e.g., zinc complex, aluminum complex, gallium complex).

In the light-emitting device of the present invention, a layer containing a compound having an ionization potential of 5.9 eV or more (preferably 6.0 eV or more) is preferably used between the cathode and the light-emitting layer, and it is more preferred to use an electron-transporting layer having an ionization potential of 5.9 eV or more.

The method for forming the organic layer containing the compound of the present invention in the light-emitting device is not particularly limited but tramples of the method include a resistance heating vapor deposition method, an electron beam method, a sputtering method, a molecular lamination method, a coating method (e.g., spray coating, dip coating, impregnation, roll coating, gravure coating, reverse coating, roll brush coating, air knife coating, curtain coating, spin coating, flow coating, bar coating, microgravure coating, air doctor coating, blade coating, squeeze coating, transfer roll coating, kiss coating, cast coating, extrusion coating, wire bar coating, screen coating), an inkjet method and a transfer method. Among these, in view of property and production, a coating method and a transfer method are preferred. The organic layer containing the compound of the present invention is formed on the substrate by any one of these methods. The thickness of the layer is not particularly limited and is preferably 10 nm or more, more preferably from 50 nm to 5 μm.

The light-emitting device of the present invention is a device where at least one organic layer containing an organic compound, the organic layer including at least light-emitting layer, is formed between paired electrodes of anode and cathode. Other than the light emitting layer, the light-emitting device may have a hole-injecting layer, a hole-transporting layer, an electron-injecting layer, an electron-transporting layer, a protective layer and the like. These layers each may be imparted with other functions. For the formation of each layer, various materials can be used.

The anode supplies a hole to the hole-injecting layer, the hole-transporting layer, the light-emitting layer and the like, and may be formed of a metal, an alloy, a metal oxide, an electrically conducting compound or a mixture thereof but is preferably formed of a material having a work function of 4 eV or more. Specific examples of this material include an electrically conducting metal oxide such as tin oxide, zinc oxide, indium oxide and indium tin oxide (ITO), a metal such as gold, silver, chromium and nickel, a mixture or laminate of these metal and electrically conducting metal oxide, an electrically conducting inorganic material such as copper iodide and copper sulfide, an electrically conducting organic material such as polyaniline, polythiophene and polypyrrole, and a laminate of such a material with ITO. Among these, an electrically conducting metal oxide is preferred and in view of productivity, high electrical conductivity and transparency, ITO is more preferred. The thickness of the anode may be appropriately selected according to the material but usually, the thickness is preferably from 10 nm to 5 μm, more preferably from 50 nm to 1 μm, still more preferably from 100 to 500 nm.

The anode is usually a layer formed on a soda-lime glass, a non-alkali glass, a transparent resin substrate or the like. In the case of using a glass, the construction material thereof is preferably a non-alkali glass so as to cause less elution of ion from the glass. Also, in the case of using a soda-lime glass, the soda-lime glass is preferably used after applying thereto a barrier coat such as silica. The thickness of the substrate is not particularly limited as long as it is large enough to maintain the mechanical strength but the substrate usually used has a thickness of 0.2 mm or more, preferably 0.7 mm or more.

For the production of the anode, various methods are used according to the material but, for example, in the case of ITO, the film formation is performed by an electron beam method, a sputtering method, a resistance heating vapor deposition method, a chemical reaction method (e.g., sol-gel method), a method of coating a dispersion of indium tin oxide, or the like.

By subjecting the anode to cleaning or other treatments, the driving voltage of the device may be decreased or the light emission efficiency may be elevated. For example, in the case of ITO, a UV-ozone treatment, a plasma treatment and the like are effective.

The cathode supplies an electron to the electron-injecting layer, the electron-transporting layer, the light-emitting layer and the like, and is selected by taking account of, for example, ionization potential, stability and adhesion to the layer adjacent to the negative electrode, such as electron-injecting layer, electron-transporting layer and light-emitting layer. As for the material of the cathode, a metal, an alloy, a metal halide, a metal oxide, an electrically conducting compound or a mixture thereof can be used. Specific examples thereof include an alkali metal (e.g., Li, Na, K) or a fluoride or oxide thereof, an alkaline earth metal (e.g., Mg, Ca) or a fluoride or oxide thereof, gold, silver, lead, aluminum, a sodium-potassium alloy or a mixed metal thereof a lithium-aluminum alloy or a mixed metal thereof a magnesium-silver alloy or a mixed metal thereof, and a rare earth metal such as indium and ytterbium. Among these, preferred are materials having a work function of 4 eV or less, more preferred are aluminum, a lithium-aluminum alloy or a mixed metal thereof and a magnesium-silver alloy or a mixed metal thereof. The cathode may take not only a single layer structure comprising the above-described compound or mixture but also a laminated structure comprising the above-described compound or mixture, For example, a laminated structure of aluminum/lithium fluoride or aluminum/lithium oxide is preferred. The thickness of the cathode may be appropriately selected according to the material but usually, the thickness is preferably from 10 nm to 5 μm more preferably from 50 nm to 1 μm, still more preferably from 100 nm to 1 μm.

For the production of the cathode, an electron beam method, a sputtering method, a resistance heating vapor deposition method, a coating method, a transfer method and the like are used. The metal in an elementary form may be vapor-deposited or two or more components may be simultaneously vapor-deposited. Furthermore, a plurality of metals may be vapor-deposited to form an alloy electrode, or a previously prepared alloy may be vapor-deposited.

The sheet resistance of the anode and cathode is preferably lower and is preferably hundreds of Ω/square or less.

The material for the light-emitting layer may be any material as long as it can form a layer having a function of injecting a hole from the anode, hole-injecting layer or hole-transporting layer as well as injecting an electron from the cathode, electron-injecting layer or electron-transporting layer when an electric field is applied, a function of moving the injected electron or a function of providing a site where a hole and an electron are recombined to effect light emission. Examples of the material include, other than the compounds of the present invention, various metal complexes as represented by a metal complex and a rare earth complex of benzoxazole, benzimidazole, benzothiazole, styrylbenzene, polyphenyl, diphenylbutadiene, tetraphenylbutadiene, naphthalimide, coumarin, perylene, perynone, oxadiazole, aldazine, pyralidine, cyclopentadiene, bisstyrylanthracene, quinacridone, pyrrolopyridine, thiadiazolopyridine; cyclopentadiene, styrylamine, aromatic dimethylidine compound and 8-quinolinol; a polymer compound such as polythiophene, polyphenylene and polyphenylenevinylene; an organic silane an iridium trisphenylpyridine complex; a transition metal complex as represented by platinum porphyrin complex; and derivatives thereof. The thickness of the light-emitting layer is not particularly limited but usually, the thickness is preferably from 1 nm to 5 µm, more preferably from 5 nm to 1 µm, still more preferably from 10 to 500 nm.

The method for forming the light-emitting layer is not particularly limited but, for example, a resistance heating vapor deposition method, an electron beam method, a sputtering method, a molecular nation method, a coating method, an inkjet method, a printing method, an LB method and a transfer method are used. Among these, preferred are a resistance heating vapor deposition method and a coating method.

The light-emitting layer may be formed of a single compound or a plurality of compounds. Furthermore, one light-emitting layer may be formed, or a plurality of light-emitting layers may be formed and respective layers may emit light differing in the color, for example, may emit white light. The white light may also be emitted from a single light-emitting layer. In the case where a plurality of light-emitting layers are formed, each light-emitting layer may be formed of a single material or a plurality of compounds.

The material for the hole-injecting layer and hole-transporting layer may be sufficient it has any one of a function of injecting a hole from the anode, a function of transporting a hole and a function of blocking an electron injected from the cathode. Specific examples of the material include an electrically conducting polymer oligomer such as carbazole, triazole, oxazole, oxadiazole, imidazole, polyarylalkane, pyrazoline, pyrazolone, phenylenediamine, arylamine, amino-substituted chalcone, styrylanthracene, fluorenone, hydrazone, stilbene, silazane, aromatic tertiary amine compound, styrylamine compound, aromatic dimethylidine-based compound, porphyrin-based compound, polysilane-based compound, poly(N-vinylcarbazole), aniline-based copolymer, thiophene oligomer and polythiophene; an organic silane; a carbon film; the compounds of the present invention; and derivatives thereof. The thickness of the hole-injecting layer is not particularly limited but usually, the thickness is preferably from 1 to 5 nm, more preferably from 1 to 100 nm, still more preferably from 1 to 10 nm. The thickness of the hole-transporting layer is not particularly limited but usually, the thickness is preferably from 1 nm to 5 µm, more preferably from 5 nm to 1 µm still more preferably from 10 to 500 nm. The hole-injecting layer and hole-transporting layer each may be have a single layer structure formed of one or more material described above or may have a multilayer structure comprising a plurality of layers having the same or different compositions.

As for the method of forming the hole-injecting layer and hole-transporting layer, a vacuum vapor deposition method, an LB method, a method of dissolving or dispersing the hole-injecting/transporting material described above in a solvent and coating the obtained solution, an inkjet method, a printing method and a transfer method are used. In the case of a coating method, the material can be dissolved or dispersed together with a resin component. Examples of the resin component include polyvinyl chloride, polycarbonate, polystyrene, polymethyl methacrylate, polybutyl methacrylate, polyester, polysulfone, polyphenylene oxide, polybutadiene, poly(N-vinylcarbazole), hydrocarbon resin, ketone resin, phenoxy resin, polyamide, ethyl cellulose, vinyl acetate, ABS resin, polyurethane, melamine resin, unsaturated polyester resin, alkyd resin, epoxy resin and silicon resin.

The material for the electron-injecting layer and electron-transporting layer may be sufficient if it has any one of a function of injecting an electron from the cathode, a function of transporting an electron and a function of blocking the hole injected from the anode. Specific examples of the material include various metal complexes as represented by a metal complex of aromatic ring tetracarboxylic acid anhydride (e.g., triazole, oxazole, oxadiazole, imidazole, fluorenone, anthraquinodimethane, anthrone, diphenylquinone; thiopyranedioxide, carbodiimide, fluorenilidenemethane, distyrylpyrazine, naphthalene, perylene), phthalocyanine and 8-quinolinol, and a metal complex comprising metal phthalocyanine, benzoxazole or benzothiazole as a ligand; an organic silane; and derivatives thereof. The thickness of the electron-injecting layer and electron-transporting layer is not particularly limited but usually, the thickness is preferably from 1 nm to 5 µm, more preferably from 5 nm to 1 µm, still more preferably from 10 nm to 500 nm. The electron-injecting layer and electron-transporting layer each may have a single layer structure formed of one or more material described above or may have a multilayer structure comprising a plurality of layers having the same or different compositions.

As for the method of for the electron-injecting layer and electron-transporting layer, a vacuum vapor deposition method, an LB method, a method of dissolving or dispersing the electron-injecting/transporting material described above in a solvent and coating the obtained solution, an inkjet method, a printing method and a transfer method are used. In the case of a coating method, the material can be dissolved or dispersed together with a resin component. As for the resin component, for example, those described above with respect to the hole-injecting/transporting layer can be used.

The material for the protective layer may be sufficient if it has a function of preventing a material which accelerates the deterioration of the device, such as water content and oxygen, from entering into the device. Specific examples of the material include a metal such as In, Sn, Pb, Au, Cu, Ag, Al, Ti and Ni, a metal oxide such as MgO, SiO, $SiO_2$, $Al_2O_3$, GeO, NiO, CaO, BaO, $Fe_2O_3$, $Y_2O_3$ and $TiO_2$, a metal fluoride such as $MgF_2$, LiF, $AlF_3$ and $CaF_2$, a nitride such as $SiN_x$ and $SiO_xN_y$, polyethylene, polypropylene, polymethyl methacrylate, polyimide, polyurea, polytetrafluoroethylene, polychlorotrifluoroethylene, polydichlorofluoroethylene, a copolymer of chlorotrifluoroethylene and dichlorodifluoroethylene, a copolymer obtained by the copolymerization of tetrafluoroethylene and a monomer mixture containing at least one comonomer, a fluorine-containing copolymer having a cyclic structure in the copolymer main chain, a water-absorbing substance having a water absorption percentage of 1% or more, and a moisture-resistant substance having a water absorption percentage of 0.1% or less.

The method for forming the protective layer is also not particularly limited and, for example, a vacuum vapor deposition method, a sputtering method, a reactive sputtering method, an UBE (molecular beam epitaxy) method, a cluster ion beam method, an ion plating method, a plasma polymerization method (high frequency excited ion plating method), a plasma CVD method, a laser CVD method, a heat CVD method, a gas source CVD method, a coating method, a printing method and a transfer method can be used.

EXAMPLES

The present invention is described in greater detail below by referring to Examples, but the embodiment of the present invention is not limited thereto.

Comparative Example 1

A cleaned ITO substrate is placed in a vapor deposition apparatus and after vapor-depositing NPD to a thickness of 50 nm, CBP and 1-1' (compound described in International Publication No. 2004/039914) at a mass ratio (weight ratio) of 10:1 were vapor-deposited thereon to a thickness of 40 nm. Furthermore, BAlq and then Alq were vapor-deposited thereon to a thickness of 10 nm and 30 nm, respectively. Subsequently, a patterned mask (giving a light emission area of 4 mm×5 mm) was placed on the obtained organic thin film and thereafter, lithium fluoride and then aluminum were vapor-deposited to a thickness of 3 nm and 60 nm, respectively, to produce an organic EL device of Comparative Example 1. When a DC constant voltage (5 V) was applied to the obtained organic EL device, light emission was observed. The light was emitted at a brightness of 300 cd/m² for 10 hours.

CBP:

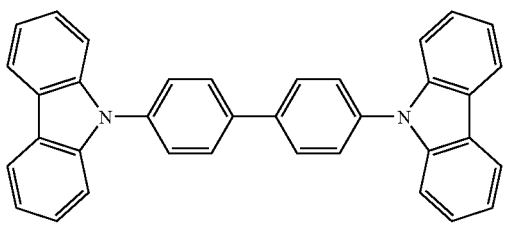

NPD:

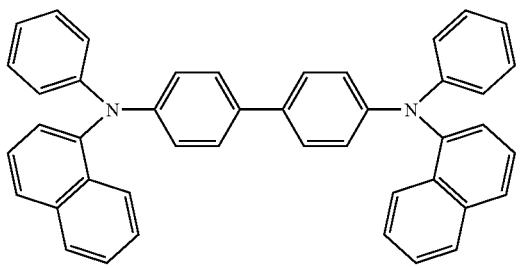

Alq:

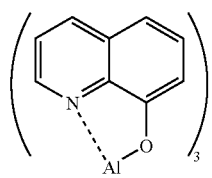

BAlq:

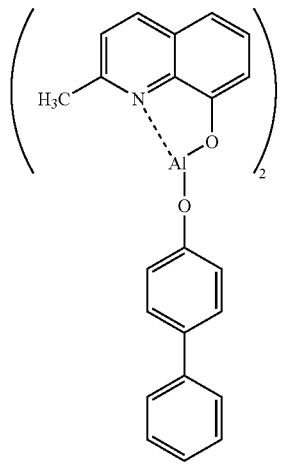

1-1' (compound described in International Publication No. 04/039914):

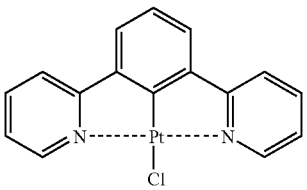

Example 1

An organic EL device of Example 1 was produced in the same manner as in Comparative Example 1 except for using Compound (121) of the present invention in place of 1-1' in Comparative Example 1. When a DC constant voltage (5 V) was applied to the obtained organic EL device, light emission was observed. The light was emitted at a brightness of 300 cd/m² for 10 hours, as a result, the half-value period of brightness was 2 times or more as compared with Comparative Example 1.

By using other compounds of the present invention in the same manner, a light-emitting device having high durability could be produced. The compounds of the present invention can give phosphorescence of blue to green, and a blue to green light-emitting device comprising the compound of the present invention can be produced.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

This application is based on Japanese Patent Application No. JP2004-271064 filed on Sep. 17, 2004, the contents of which is incorporated herein by reference.

What is claimed is:

1. An organic electroluminescent device comprising:
a pair of electrodes; and
at least one organic layer between the pair of electrodes, the at least one organic layer including a light-emitting layer,
wherein the at least one organic layer contains a compound represented by formula (I):

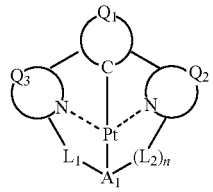

wherein $Q_1$ represents an atomic group necessary for forming an unsaturated ring together with the carbon atom; $Q_2$ and $Q_3$ each independently represents an atomic group necessary for forming an unsaturated ring together with the nitrogen atom; the atomic group of each of $Q_1$, $Q_2$ and $Q_3$ may have a hydrogen atom or a substituent; $L_1$ and $L_2$ each independently represents a linking group which may have a substituent; n represents 0; and $A_1$ represents a structure containing an atom bonded to the platinum atom, and wherein, the unsaturated ring formed by $Q_1$ is directly linked to the unsaturated ring formed by $Q_2$ and to the unsaturated ring formed by $Q_3$.

2. An organic electroluminescent device comprising:
a pair of electrodes; and
at least one organic layer between the pair of electrodes, the at least one organic layer including a light-emitting layer,
wherein the at least one organic layer contains a compound represented by formula (II):

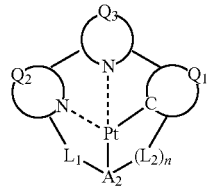

wherein $Q_1$ represents an atomic group necessary for forming an unsaturated ring together with the carbon atom; $Q_2$ and $Q_3$ each independently represents an atomic group necessary for forming an unsaturated ring together with the nitrogen atom; the atomic group of each of $Q_1$, $Q_2$ and $Q_3$ may have a hydrogen atom or a substituent; $L_1$ and $L_2$ each independently represents a linking group which may have a substituent; n represents 0; and $A_1$ represents a structure containing an atom bonded to the platinum atom, and wherein, the unsaturated ring formed by $Q_3$ is directly linked to the unsaturated ring formed by $Q_2$ and to the unsaturated ring formed by $Q_3$.

3. An organic electroluminescent device comprising:
a pair of electrodes; and
at least one organic layer between the pair of electrodes, the at least one organic layer including a light-emitting layer,
wherein the at least one organic layer contains a compound represented by formula (III):

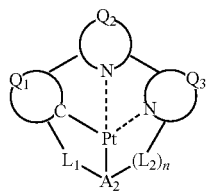

wherein $Q_1$ represents an atomic group necessary for forming an unsaturated ring together with the carbon atom; $Q_2$ and $Q_3$ each independently represents an atomic group necessary for forming an unsaturated ring together with the nitrogen atom; the atomic group of each of $Q_1$, $Q_2$ and $Q_3$ may have a hydrogen atom or a substituent; $L_1$ and $L_2$ each independently represents a linking group which may have a substituent; n represents 0; and $A_1$ represents a structure containing an atom bonded to the platinum atom, and wherein, the unsaturated ring formed by $Q_2$ is directly linked to the unsaturated ring formed by $Q_1$ and to the unsaturated ring formed by $Q_3$.

4. An organic electroluminescent device comprising:
a pair of electrodes; and
at least one organic layer between the pair of electrodes, the at least one organic layer including a light-emitting layer,
wherein the at least one organic layer contains a compound represented by formula (IV):

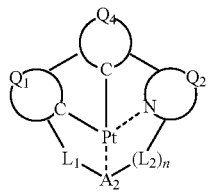

wherein $Q_1$ and $Q_4$ each independently represents an atomic group necessary for forming an unsaturated ring together with the carbon atom; $Q_2$ represents an atomic group necessary for forming an unsaturated ring together with the nitrogen atom; the atomic group of each of $Q_1$, $Q_2$ and $Q_4$ may have a hydrogen atom or a substituent; $L_1$ and $L_2$ each independently represents a linking group which may have a substituent; n represents 0; and $A_2$ represents a structure containing an atom bonded to the platinum atom, and wherein, the unsaturated ring formed by $Q_4$ is directly linked to the unsaturated ring formed by $Q_1$ and to the unsaturated ring formed by $Q_2$.

5. An organic electroluminescent device comprising:
a pair of electrodes; and
at least one organic layer between the pair of electrodes, the at least one organic layer including a light-emitting layer,
wherein the at least one organic layer contains a compound represented by formula (V):

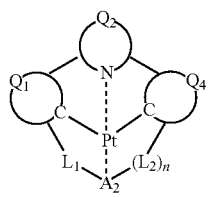

wherein $Q_1$ and $Q_4$ each independently represents an atomic group necessary for forming an unsaturated ring together with the carbon atom; $Q_2$ represents an atomic group necessary for forming an unsaturated ring together with the nitrogen atom; the atomic group of each of $Q_1$, $Q_2$ and $Q_4$ may have a hydrogen atom or a substituent; $L_1$ and $L_2$ each independently represents a linking group which may have a substituent; n represents 0; and $A_2$ represents a structure containing an atom bonded to the platinum atom, and wherein, the unsaturated ring formed by $Q_2$ is directly linked to the unsaturated ring formed by $Q_1$ and to the unsaturated ring formed by $Q_4$.

6. An organic electroluminescent device comprising:
a pair of electrodes; and
at least one organic layer between the pair of electrodes, the at least one organic layer including a light-emitting layer,
wherein the at least one organic layer contains a compound represented by formula (VI):

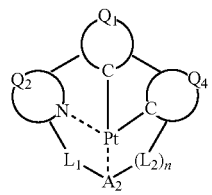

wherein $Q_1$ and $Q_4$ each independently represents an atomic group necessary for forming an unsaturated ring together with the carbon atom; $Q_2$ represents an atomic group necessary for forming an unsaturated ring together with the nitrogen atom; the atomic group of each of $Q_1$, $Q_2$ and $Q_4$ may have a hydrogen atom or a substituent; $L_1$ and $L_2$ each independently represents a linking group which may have a substituent; n represents 0; and $A_2$ represents a structure containing an atom bonded to the platinum atom, and wherein, the unsaturated ring formed by $Q_1$ is directly linked to the unsaturated ring formed by $Q_2$, and to the unsaturated ring formed by $Q_4$.

7. The organic electroluminescent device of claim 1, wherein the compound represented by formula (I) is a compound represented by formula (VII):

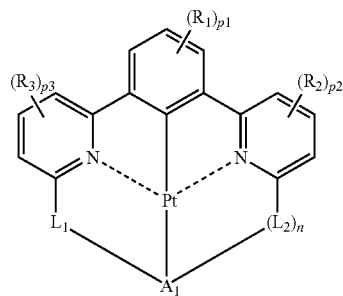

wherein $R_1$, $R_2$ and $R_3$ each independently represents a substituent; p1, p2 and p3 each independently represents an integer of 0 to 3; when p1 to p3 each is 2 or more, multiple $R_1$s, $R_2$s or $R_3$s are the same or different and each pair of $R_1$ and $R_1$, $R_2$ and $R_2$, $R_3$ and $R_3$, $R_1$ and $R_2$, $R_2$ and $R_3$, and $R_1$ and $R_3$ may combine with each other to form a ring; when p1 is 0, the benzene ring has no $R_1$, and when p2 and p3 each is 0, the pyridine rings have no $R_2$ and $R_3$; and $L_1$, $L_2$, n and $A_1$ have the same meanings as $L_1$, $L_2$, n and $A_1$ in formula (I).

8. The organic electroluminescent device of claim 2, wherein the compound represented by formula (II) is a compound represented by formula (VIII):

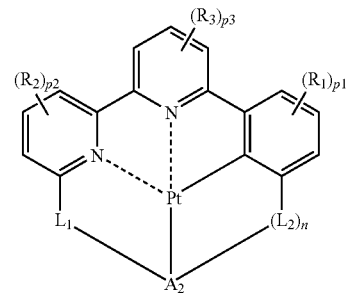

wherein $R_1$, $R_2$ and $R_3$ each independently represents a substituent; p1, p2 and p3 each independently represents an integer of 0 to 3; when p1 to p3 each is 2 or more, multiple $R_1$s, $R_2$s or $R_3$s are the same or different and each pair of $R_1$ and $R_1$, $R_2$ and $R_2$, $R_3$ and $R_3$, $R_1$ and $R_2$, $R_2$ and $R_3$, and $R_1$ and $R_3$ may combine with each other to form a ring; when p1 is 0, the benzene ring has no $R_1$, and when p2 and p3 each is 0, the pyridine rings have no $R_2$ and $R_3$; and $L_1$, $L_2$, n and $A_1$ have the same meanings as $L_1$, $L_2$, n and $A_1$ in formula (II).

9. The organic electroluminescent device of claim 3, wherein the compound represented by formula (III) is a compound represented by formula (IX):

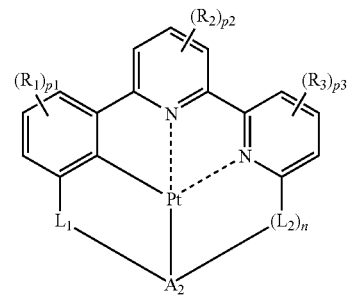

wherein $R_1$, $R_2$ and $R_3$ each independently represents a substituent; p1, p2 and p3 each independently represents an integer of 0 to 3; when p1 to p3 each is 2 or more, multiple $R_1$s, $R_2$s or $R_3$s are the same or different and each pair of $R_1$ and $R_1$, $R_2$ and $R_2$, $R_3$ and $R_3$, $R_1$ and $R_2$, $R_2$ and $R_3$, and $R_1$ and $R_3$ may combine with each other to form a ring; when p1 is 0, the benzene ring has no $R_1$, and when p2 and p3 each is 0, the pyridine rings have no $R_2$ and $R_3$; and $L_1$, $L_2$, n and $A_1$ have the same meanings as $L_1$, $L_2$, n and $A_1$ in formula (III).

10. The organic electroluminescent device of claim 4, wherein the compound represented by formula (IV) is a compound represented by formula (X):

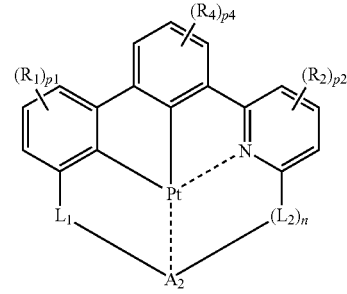

wherein $R_1$, $R_2$ and $R_4$ each independently represents a substituent; p1, p2 and p4 each independently represents an integer of 0 to 3; when p1, p2 and p4 each is 2 or more, multiple R$_1$s, R$_2$s or R$_4$s are the same or different and each pair of R$_1$ and R$_1$, R$_2$ and R$_2$, R$_4$ and R$_4$, R$_1$ and R$_2$, R$_2$ and R$_4$, and R$_1$ and R$_4$ may combine with each other to form a ring; when p1 and p4 each is 0, the benzene rings have no R$_1$ and R$_4$, and when p2 is 0, the pyridine ring has no R$_2$; and L$_1$, L$_2$, n and A$_2$ have the same meanings as L$_1$, L$_2$, n and A$_2$ in formula (IV).

11. The organic electroluminescent device of claim 5, wherein the compound represented by formula (V) is a compound represented by formula (XI):

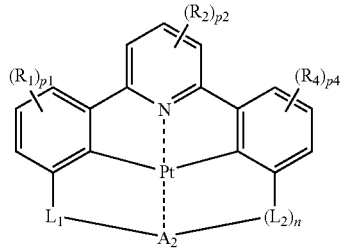

wherein R$_1$, R$_2$ and R$_4$ each independently represents a substituent; p1, p2 and p4 each independently represents an integer of 0 to 3; when p1, p2 and p4 each is 2 or more, multiple R$_1$s, R$_2$s or R$_4$s are the same or different and each pair of R$_1$ and R$_1$, R$_2$ and R$_2$, R$_4$ and R$_4$, R$_1$ and R$_2$, R$_2$ and R$_4$, and R$_1$ and R$_4$ may combine with each other to form a ring; when p1 and p4 each is 0, the benzene rings have no R$_1$ and R$_4$, and when p2 is 0, the pyridine ring has no R$_2$; and L$_1$, L$_2$, n and A$_2$ have the same meanings as L$_1$, L$_2$, n and A$_2$ in formula (V).

12. The organic electroluminescent device of claim 6, wherein the compound represented by formula (VI) is a compound represented by formula (XII):

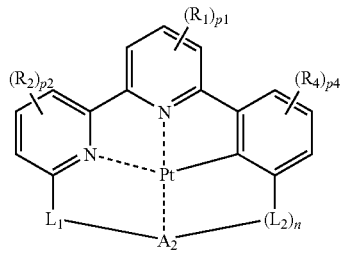

wherein R$_1$, R$_2$ and R$_4$ each independently represents a substituent; p1, p2 and p4 each independently represents an integer of 0 to 3; when p1, p2 and p4 each is 2 or more, multiple R$_1$s, R$_2$s or R$_4$s are the same or different and each pair of R$_1$ and R$_1$, R$_2$ and R$_2$, R$_4$ and R$_4$, R$_1$ and R$_2$, R$_2$ and R$_4$, and R$_1$ and R$_4$ may combine with each other to form a ring; when p1 and p4 each is 0, the benzene rings have no R$_1$ and R$_4$, and when p2 is 0, the pyridine ring has no R$_2$; and L$_1$, L$_2$, n and A$_2$ have the same meanings as L$_1$, L$_2$, n and A$_2$ in formula (VI).

13. An organic electroluminescent device comprising:
a pair of electrodes; and
at least one organic layer between the pair of electrodes, the at least one organic layer including a light-emitting layer,
wherein the at least one organic layer contains a compound represented by formula (I), (II), (III), (IV), (V), or (VI):

Formula (I)
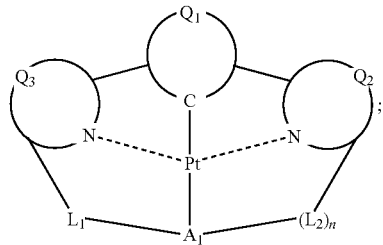

(Formula (II))
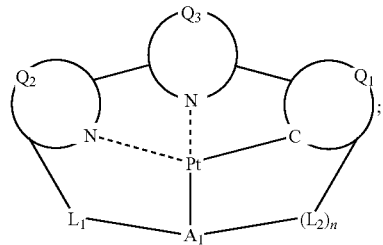

Formula (III)
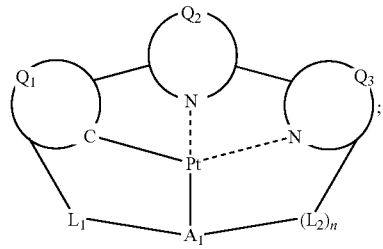

Formula (IV)
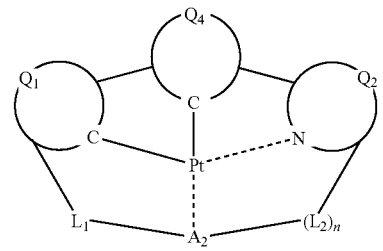

Formula (V)
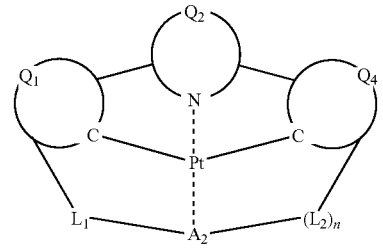

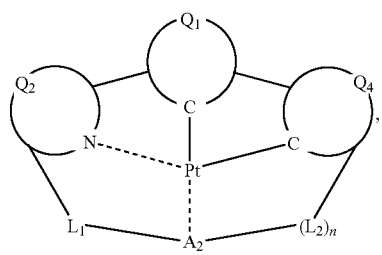

Formula (VI)

wherein, $Q_1$ and $Q_4$ represent an atomic group necessary for forming an unsaturated ring together with the carbon atom; $Q_2$ and $Q_3$ each independently represents an atomic group necessary for forming an unsaturated ring together with the nitrogen atom; the atomic group of each of $Q_1$, $Q_2$, $Q_3$, and $Q_4$ may have a hydrogen atom or a substituent; $L_1$ and $L_2$ each independently represents a linking group which may have a substituent; n represents 0; and $A_1$ and $A_2$ each represent a structure containing an atom bonded to the platinum atom, and wherein the links between respective unsaturated rings formed by $Q_1$-$Q_4$ are a direct bond.

* * * * *